(12) United States Patent
Shibata

(10) Patent No.: US 10,964,369 B2
(45) Date of Patent: Mar. 30, 2021

(54) MEMRISTOR CIRCUIT, MEMRISTOR CONTROL SYSTEM, ANALOG PRODUCT-SUM OPERATOR, AND NEUROMORPHIC DEVICE

(71) Applicant: TDK CORPORATION, Tokyo (JP)

(72) Inventor: Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/577,067

(22) Filed: Sep. 20, 2019

(65) Prior Publication Data

US 2020/0098412 A1 Mar. 26, 2020

(30) Foreign Application Priority Data

Sep. 26, 2018 (JP) .............................. JP2018-180548

(51) Int. Cl.
| | | |
|---|---|---|
| *G11C 11/00* | (2006.01) | |
| *G11C 11/16* | (2006.01) | |
| *H01L 27/22* | (2006.01) | |
| *H01L 43/02* | (2006.01) | |

(52) U.S. Cl.
CPC ........ *G11C 11/1697* (2013.01); *G11C 11/161* (2013.01); *H01L 27/228* (2013.01); *H01L 43/02* (2013.01)

(58) Field of Classification Search
CPC . G11C 11/1697; G11C 11/161; H01L 27/228; H01L 43/02
USPC .......................................................... 365/148
See application file for complete search history.

(56) References Cited

U.S. PATENT DOCUMENTS

| | | | | |
|---|---|---|---|---|
| 6,201,259 | B1* | 3/2001 | Sato | ...................... H01L 27/228 |
| | | | | 257/30 |
| 2005/0219771 | A1* | 10/2005 | Sato | ................. G11B 20/10009 |
| | | | | 360/324.2 |
| 2008/0205121 | A1* | 8/2008 | Chen | .................... G11C 11/1653 |
| | | | | 365/158 |

(Continued)

FOREIGN PATENT DOCUMENTS

| | | |
|---|---|---|
| JP | 5160304 B2 | 3/2013 |
| WO | 2017/183573 A1 | 10/2017 |
| WO | 2018/034163 A1 | 2/2018 |

OTHER PUBLICATIONS

Geoffrey W. Burr et al. "Neuromorphic Computing Using Non-Volatile Memory". Advances in Physics: X, 2017, vol. 2, No. 1, pp. 89-124.

(Continued)

*Primary Examiner* — Vu A Le
(74) *Attorney, Agent, or Firm* — Oliff PLC

(57) ABSTRACT

A memristor circuit that can increase a maximum rate of change of a conductance of the memristor circuit while maintaining linearity and symmetry in the change in the conductance is provided. A memristor circuit includes: a first magnetoresistance effect element including a first resistance change unit configured to change a resistance value thereof based on a current flowing therein, a first electrode provided at a first end of the first resistance change unit, and a second electrode provided at a second end of the first resistance change unit; and a first field effect transistor including a gate electrode, the gate electrode being connected to a transmission path between the first electrode connected to a power supply and the power supply.

17 Claims, 13 Drawing Sheets

(56) References Cited

U.S. PATENT DOCUMENTS

2014/0334216 A1* 11/2014 Wang ..................... G11C 11/16
                                                                  365/63
2018/0350432 A1   12/2018 Sasaki
2019/0171418 A1    6/2019 Morie et al.

OTHER PUBLICATIONS

P. Narayanan et al. "Toward On-Chip Acceleration of the Backpropagation Algorithm Using Nonvolatile Memory". IBM J. Res. & Develop, Jul./Sep. 2017, vol. 61, No. 4/5, pp. 11:1 through 11:11.
Stefano Ambrogio et al. "Equivalent-Accuracy Accelerated Neural-Network Training Using Analogue Memory". Nature, vol. 558, Jun. 7, 2018, pp. 60-67.

* cited by examiner

MEMRISTOR CIRCUIT, MEMRISTOR CONTROL SYSTEM, ANALOG PRODUCT-SUM OPERATOR, AND NEUROMORPHIC DEVICE

BACKGROUND OF THE INVENTION

Field of the Invention

The present invention relates to a memristor circuit, a memristor control system, an analog product-sum operator, and a neuromorphic device.

Priority is claimed on Japanese Patent Application No. 2018-180548, filed Sep. 26, 2018, the content of which is incorporated herein by reference.

Description of Related Art

Technologies for using memristors have been studied and developed.

Examples of kinds of memristors include an element in which a resistance value is changed by growth of a filament, oxidation-reduction, or the like, an element in which a resistance value is changed by a phase change, and a magnetoresistance effect element in which a resistance value is changed by a magnetization relation between two ferromagnetic layers.

An example of a memristor including an element in which a resistance value is changed by growth of a filament, oxidation-reduction, or the like is a resistive random access memory (ReRAM). A memristor including an element in which a resistance value is changed by a phase change is, for example, a phase change memory (PCM). A memristor including a magnetoresistance effect element in which a resistance value is changed by a magnetization relation between two ferromagnetic layers is, for example, a magnetoresistive random access memory (MRAM). In such memristors, conductance is also changed with a change in a resistance value. This is because conductance is a physical quantity that is defined by a reciprocal of a resistance value.

Here, a magnetoresistance effect element is an element in which a giant magneto resistive effect, a tunnel magnetoresistance effect, or the like is used as a magnetoresistance effect. Examples of the magnetoresistance effect element include a spin transfer torque (STT) magnetoresistance effect element in which a spin transfer torque is used, a spin orbital torque (SOT) magnetoresistance effect element in which a spin orbital torque is used, and a domain wall (DW) movement magnetoresistance effect element in which movement of a domain wall is used in a ferromagnetic layer.

A magnetoresistance effect element is an element capable of changing a magnetization relation between two ferromagnetic layers included in the magnetoresistance effect element based on a spin polarized current. Therefore, hereinafter, to facilitate the description, a memristor including a magnetoresistance effect element in which a resistance value is changed based on the magnetization relation between two ferromagnetic layers is referred to as a spin memristor in the description. Hereinafter, to facilitate the description, a memristor other than a spin memristor is referred to as a non-spin memristor.

With regard to a technology for using such memristors, Patent Document 1 discloses a method of calculating a neural network using a spin memristor (see Patent Document 1).

Non-Patent Document 1 discloses a neuromorphic device in which a non-spin memristor or a spin memristor is used (see Non-Patent Document 1).

PATENT DOCUMENTS

[Patent Document 1] PCT International Publication No. WO 2017/183573

[Non-Patent Document 1] Geoffrey W. Burr, et al., "Neuromorphic computing using non-volatile memory," ADVANCES IN PHYSICS: X, 2017, VOL. 2, NO. 1, p. 89 to 124.

Here, it is known that a non-spin memristor does not have linearity in a change in a conductance (a reciprocal of a resistance value) of the non-spin memristor. That is, the conductance of the non-spin memristor is nonlinearly changed with a change in a physical quantity (a physical quantity related to growth of a filament, a phase change, or the like) that changes the conductance of the non-spin memristor. It is also known that the non-spin memristor has no symmetry in a change in the conductance. Here, the symmetry is symmetry between a method of increasing the conductance of the non-spin memristor and a method of decreasing the conductance. That is, in the non-spin memristor, an absolute value of a rate of change of the conductance in the case of an increase from first conductance to second conductance with application of a load of a certain magnitude does not coincide with an absolute value of a rate of change of the conductance in the case of a decrease from the second conductance to the first conductance with application of a load of the same magnitude. The first conductance is equal to or greater than the minimum value of the conductance of the non-spin memristor and any conductance may be used as long as the conductance is less than the maximum value of the conductance. The second conductance is equal to or less than the maximum value and any conductance value may be used as long as the conductance is greater than the first conductance.

In this way, a non-spin memristor does not have linearity or symmetry in a change in a conductance of the non-spin memristor. Therefore, when the non-spin memristor is used as a memory cell of a neuromorphic device, characteristics of a neural network may deteriorate in the non-spin memristor in some cases. This problem is resolved by, for example, a method of configuring one memory cell using two non-spin memristors or a method of configuring one memory cell using two non-spin memristors and another element. However, in these method, it is known that the configuration of the neuromorphic device is complicated.

On the other hand, a spin memristor that has linearity in a change in a conductance the spin memristor is known. That is, the conductance of the spin memristor is changed linearly with a change in a physical quantity (a magnetization relation between two ferromagnetic layers that a magnetoresistance effect element included in the spin memristor has) for changing the conductance. It is also known that the spin memristor has symmetry in a change in the conductance is known. Here, the symmetry is symmetry between a method of increasing the conductance and a method of decreasing the conductance. That is, in the spin memristor, an absolute value of a rate of change of the conductance in the case of an increase from third conductance to fourth conductance coincides with an absolute value of a rate of change of the conductance in the case of a decrease from the fourth conductance to the third conductance except for a difference due to an error. The third conductance is equal to or greater than a minimum value of the conductance of the spin memristor and any conductance may be used as long as the conductance is less than the maximum value of the conductance. The fourth conductance is equal to or less than the maximum value and any conductance may be used as long as the conductance is greater than the third conductance.

In this way, a spin memristor has linearity and symmetry in a change in a conductance of the spin memristor. Therefore, when a spin memristor is used as a memory cell of a neuromorphic device, one memory cell can be configured using one spin memristor without characteristics of a neural network deteriorating. As a result, the spin memristor can simplify the configuration of the neuromorphic device and improve durability and reliability of the neuromorphic device.

In view of the foregoing circumstances, it is preferable to use a spin memristor in a memory cell of a neuromorphic device. However, in a spin memristor, a maximum rate of change of a conductance of the spin memristor when the conductance is changed within a range desired by a user is smaller than in a non-spin memristor. As a result, in a spin memristor, it is difficult to detect a change in the conductance with high precision in some cases. Thus, when the spin memristor is used as the memory cell of the neuromorphic device, precision of calculation of the neural network is lowered in some cases. The maximum rate of change is a rate of change of the conductance when a conductance of the spin memristor is changed from a minimum value to a maximum value within the range.

As a method of solving this problem, a charge detection method has been suggested. However, when a charge detection method is used for a neuromorphic device along with a spin memristor, it is known that a time necessary for calculation of a neural network is long. That is, in the spin memristor of this case, calculation performance of a neural network may deteriorate and power consumption may increase in some cases.

The present invention is devised in view of such circumstances and an object of the present invention is to provide a memristor circuit, a memristor control system, an analog product-sum operator, and a neuromorphic device capable of causing a maximum rate of change of a conductance of the memristor circuit to be large while maintaining linearity and symmetry in a change in the conductance.

SUMMARY OF THE INVENTION

According to an aspect of the present invention, there is provided a memristor circuit including: a first magnetoresistance effect element including a first resistance change unit configured to change a resistance value thereof based on a current flowing therein, a first electrode provided at a first end of the first resistance change unit, and a second electrode provided at a second end of the first resistance change unit; and a first field effect transistor including a gate electrode, the gate electrode connected to a transmission path between the first electrode connected to a power supply and the power supply.

According to another aspect of the present invention, there is provided a memristor control system including: the memristor circuit according to claim 1; and a control unit configured to control the memristor circuit, wherein the first magnetoresistance effect element is a domain wall movement magnetoresistance effect element, wherein the first resistance change unit has a domain wall, wherein a third electrode is provided at a third end of the first resistance change unit, wherein, in the first resistance change unit, a resistance value is changed by movement of the domain wall based on a current flowing between the second and third electrodes, and wherein the control unit changes a resistance value of the first resistance change unit by causing a pulse current with a pulse width to flow based on a resistance value of the first resistance change unit between the second electrode and the third electrode.

According to still another aspect of the present invention, there is provided an analog product-sum operator including one memristor circuit or the plurality of memristor circuits.

According to still another aspect of the present invention, there is provided a neuromorphic device including one memristor circuit or the plurality of memristor circuits.

According to the aspects of the present invention, it is possible to cause a maximum rate of change of a conductance of a memristor circuit to be large while maintaining linearity and symmetry in a change in the conductance

DETAILED DESCRIPTION OF THE INVENTION

<Embodiments>

Hereinafter, an embodiment of the present invention will be described with reference to the drawings. In the embodiment, a conductor transferring an electric signal is referred to as a transmission path in the description. For example, the transmission path may be a conductor printed on a substrate or may be a conductor such as a conductor formed in a line shape.

<Configuration of Memristor Control System>

Figure 1:
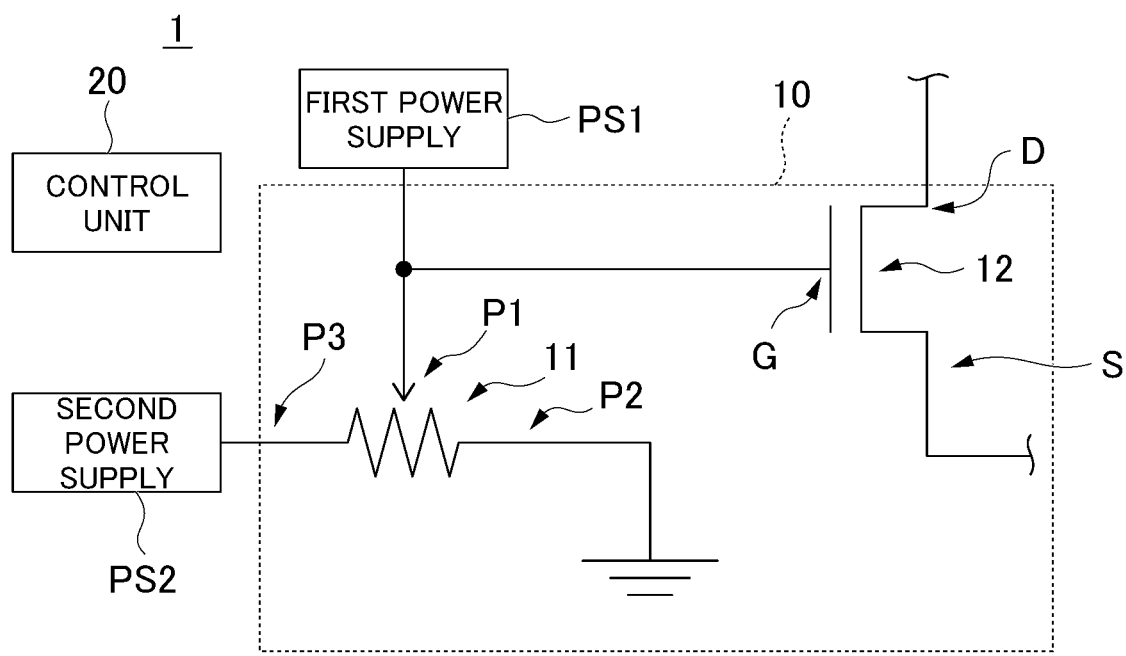
FIG. 1 is a diagram illustrating an example of a configuration of a memristor control system 1 according to an embodiment.

FIG. 1 is a diagram illustrating an example of a configuration of a memristor control system 1 according to an embodiment.

The memristor control system 1 includes a memristor circuit 10 and a control unit 20. The memristor circuit 10 includes a first magnetoresistance effect element 11 and a first field effect transistor 12.

The first magnetoresistance effect element 11 is an element in which a giant magnetoresistive effect, a tunnel magnetoresistance effect, or the like is used as a magnetoresistance effect. In the first magnetoresistance effect element 11, a resistance value of the first magnetoresistance effect element 11 is changed by a magnetization relation between two ferromagnetic layers included in the first magnetoresistance effect element 11. In the first magnetoresistance effect element 11, the magnetization relation between the two ferromagnetic layers can be changed by a spin polarized current.

The first magnetoresistance effect element 11 is, for example, a spin transfer torque (STT) magnetoresistance effect element in which a spin transfer torque is used, a spin orbital torque (SOT) magnetoresistance effect element in which a spin orbital torque is used, or a domain wall (DW) movement magnetoresistance effect element in which movement of a domain wall is used in a ferromagnetic layer.

Hereinafter, a case in which the first magnetoresistance effect element 11 is a domain wall movement magnetoresistance effect element will be described as an example. The first magnetoresistance effect element 11 may be an STT magnetoresistance effect element, may be an SOT magnetoresistance effect element, or may be another magnetoresistance effect element instead of a domain wall movement magnetoresistance effect element.

A first end of the first magnetoresistance effect element 11 is provided a first electrode P1. A second end of the first magnetoresistance effect element 11 is provided a second electrode P2. A third end of the first magnetoresistance effect element 11 is provided a third electrode P3. When the first magnetoresistance effect element 11 is an STT magnetoresistance effect element, the first magnetoresistance effect element 11 does not include the third electrode P3.

In the example illustrated in FIG. 1, the first electrode P1 is connected to a first power supply PS1 via a transmission path. The first power supply PS1 is a power supply that apply a voltage between the first electrode P1 and the second electrode P2 in response to a request from the control unit 20, and causes a current to flow from the first electrode P1 to the second electrode P2.

In the example illustrated in FIG. 1, the second electrode P2 is grounded to the ground via a transmission path.

In the example illustrated in FIG. 1, the third electrode P3 is connected to a second power supply PS2 via a transmission path. The second power supply PS2 is a power supply that apply a voltage between the second electrode P2 and the third electrode P3 in response to a request from the control unit 20, and causes a current to flow from the second electrode P2 to the third electrode P3 or flow from the third electrode P3 to the second electrode P2.

Figure 2:
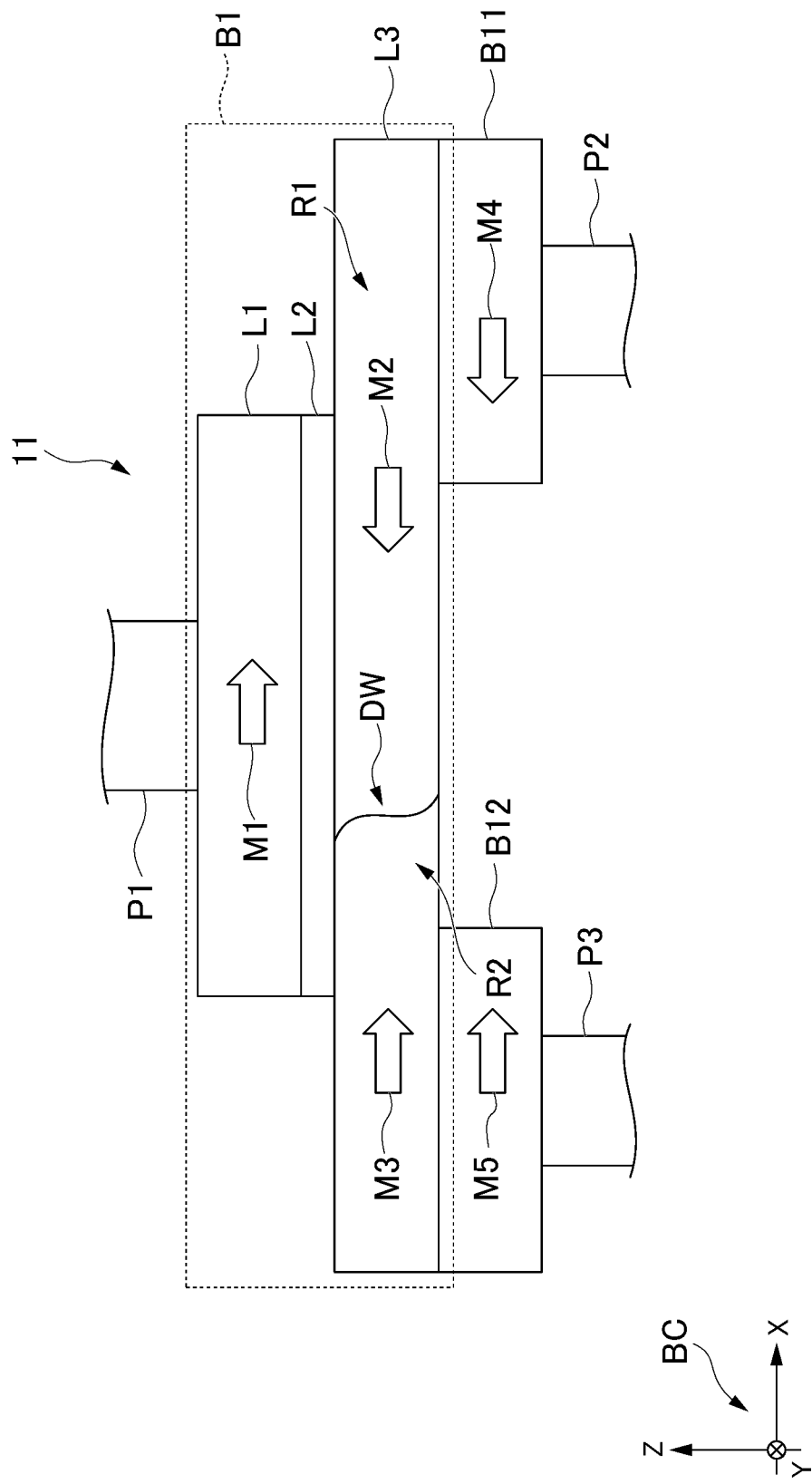
FIG. 2 is a diagram illustrating an example of a configuration of a first magnetoresistance effect element 11.

Hereinafter, a configuration of the first magnetoresistance effect element 11 will be described with reference to FIG. 2. FIG. 2 is a diagram illustrating an example of the configuration of the first magnetoresistance effect element 11.

The first magnetoresistance effect element 11 includes a first resistance change unit B1, a first magnetization fixing unit B11, a second magnetization fixing unit B12, the first electrode P1, the second electrode P2, and the third electrode P3.

The first resistance change unit B1 includes two ferromagnetic layers. A resistance value of the first resistance change unit B1 is changed by a magnetization relation between the two ferromagnetic layers. Specifically, the first resistance change unit B1 includes a first ferromagnetic layer L1, a nonmagnetic layer L2, and a magnetic recording layer L3. Hereinafter, a case in which the shape of the magnetic recording layer L3 is a plate rectangular parallelepiped will be described as an example. Instead of this, the shape of the magnetic recording layer L3 may be another shape.

Here, a 3-dimensional coordinate system BC illustrated in FIG. 2 is a right-handed 3-dimensional orthogonal coordinate system in which a longitudinal direction of the magnetic recording layer L3 coincides with the X axis direction and a transverse direction of the magnetic recording layer L3 coincides with the Y direction. That is, the first magnetoresistance effect element 11 illustrated in FIG. 2 is the first magnetoresistance effect element 11 when viewed in the negative direction of the Y axis in the 3-dimensional coordinate system BC. Hereinafter, to facilitate the description, the positive direction of the Z axis is referred to as an upper side or upward direction and the negative direction of the Z axis is a lower side or downward direction in the 3-dimensional coordinate system BC.

In the first resistance change unit B1, the first ferromagnetic layer L1, the nonmagnetic layer L2, and the magnetic recording layer L3 are stacked from the lower side to the upper side in the order of the magnetic recording layer L3, the nonmagnetic layer L2, and the first ferromagnetic layer L1, as illustrated in FIG. 2.

The first ferromagnetic layer L1 includes a ferromagnetic body. The first ferromagnetic layer L1 is one of the two ferromagnetic layers included in the first resistance change unit B1. In the first ferromagnetic layer L1, a magnetization direction is fixed. A direction M1 indicated by an arrow illustrated in FIG. 2 is an example of a magnetization direction fixed in the first ferromagnetic layer L1. In the example illustrated in FIG. 2, the direction M1 coincides with the positive direction of the X axis in the 3-dimensional coordinate system BC.

In the example illustrated in FIG. 2, the above-described first electrode P1 is provided in an upper side portion of the first ferromagnetic layer L1. The upper side portion of the first ferromagnetic layer L1 is an example of the first end of the above-described first resistance change unit B1.

As a ferromagnetic material of which the first ferromagnetic layer L1 is made, for example, a metal selected from a group consisting of Cr, Mn, Co, Fe, and Ni, an alloy including one or more of these metals, or an alloy including at least one of these metals B, C, and N can be used. Specifically, Co—Fe, Co—Fe—B, or Ni—Fe can be exemplified.

A material of which the first ferromagnetic layer L1 is made may be a Heusler alloy. A Heusler alloy is a half metal and has high spin polarizability. A Heusler alloy is an intermetallic compound that has a chemical composition of $X_2YZ$. Here, X is a noble metal element or a transition metal element of the Co, Fe, Ni, or Cu group in the periodic table. Y is a transition metal of the Mn, V, Cr, or Ti group or the elemental species of X. Z is a typical element of Group III to Group V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$.

A case of that it directs magnetization of the first ferromagnetic layer L1 to the direction along the XY plane (a case of that it makes the first ferromagnetic layer L1 to an in-plane magnetization film), for example, NiFe is preferably used as the material of which the first ferromagnetic layer L1. The XY plane is a plane parallel to both the X and Y axes in the 3-dimensional coordinate system BC. On the other hand, a case of that it directs magnetization of the first ferromagnetic layer L1 to a direction along the Z axis (a case of that it makes the first ferromagnetic layer L1 to a vertical magnetization film), for example, a Co/Ni stacked film, a Co/Pt stacked film, or the like is preferably used as the material of which the first ferromagnetic layer L1. The Z axis is the Z axis in the 3-dimensional coordinate system BC.

The structure of the first ferromagnetic layer L1 may be a synthetic structure formed by a ferromagnetic layer and a nonmagnetic layer or may be a synthetic structure formed by an antiferromagnetic layer, a ferromagnetic layer, and a nonmagnetic layer in order to fix magnetization. When the structure of the first ferromagnetic layer L1 is a synthetic structure formed by an antiferromagnetic layer, a ferromagnetic layer, and a nonmagnetic layer, a magnetization direction of the first ferromagnetic layer L1 is maintained more strongly by the antiferromagnetic layer. Therefore, in this case, the magnetization of the first ferromagnetic layer L1 is hardly influenced from the outside.

A known material can be used for the nonmagnetic layer L2. For example, when the nonmagnetic layer L2 is made of an insulator (that is, the nonmagnetic layer L2 is a tunnel barrier layer), $Al_2O_3$, $SiO_2$, MgO, and $MgAl_2O_4$, and the like can be used as its material. The nonmagnetic layer L2 may be used materials that some of Al, Si, and Mg are substituted with Zn, Be, and the like. When the nonmagnetic layer L2 is made of a metal, Cu, Au, Ag and the like can be used as its material. Further, when the nonmagnetic layer L2 is made of a semiconductor, Si, Ge, $CuInSe_2$, $CuGaSe_2$, $Cu(In, Ga)Se_2$, and the like can be used as its material.

The magnetic recording layer L3 includes a ferromagnetic body. The magnetic recording layer L3 is the other of the two ferromagnetic layers included in the first resistance change unit B1. A domain wall DW is included inside the magnetic recording layer L3. The domain wall DW is a boundary between a magnetic region R1 and a magnetic region R2 of which magnetization directions inside the magnetic recording layer L3 are oriented in mutually opposite directions. That is, two magnetic regions, the magnetic region R1 and the magnetic region R2, are included inside the magnetic recording layer L3. A direction M2 indicated by an arrow illustrated in FIG. 2 is an example of a magnetization direction in the magnetic region R1. In the example illustrated in FIG. 2, the direction M2 coincides with the negative direction of the X axis in the 3-dimensional coordinate system BC. A direction M3 indicated by an arrow illustrated in FIG. 2 is an example of a magnetization direction in the magnetic region R2. In the example illustrated in FIG. 2, the direction M3 coincides with the positive direction of the X axis in the 3-dimensional coordinate system BC.

A first magnetization fixing unit B11 is provided in a lower side portion at the end on the magnetic region R1 side among ends of the magnetic recording layer L3. The above-described second electrode P2 is provided in a lower side portion of the first magnetization fixing unit B11. A lower side portion at the end on the magnetic region R1 among the ends of the magnetic recording layer L3 is an example of the second end of the first resistance change unit B1. That is, in the embodiment, the second electrode P2 is provided at the second end of the first resistance change unit B1 via the first magnetization fixing unit B11.

As a ferromagnetic material of which the magnetic recording layer L3 is made, a similar material to the first ferromagnetic layer L1 can be used. The ferromagnetic material of which the magnetic recording layer L3 is made may be a different ferromagnetic material from the ferromagnetic material of which the first ferromagnetic layer L1 is made among ferromagnetic materials of which the first ferromagnetic layer L1 can be made.

The first magnetization fixing unit B11 includes a ferromagnetic body. In the first magnetization fixing unit B11, a magnetization direction is fixed. A direction M4 indicated by an arrow illustrated in FIG. 2 is an example of a magnetization direction fixed in the first magnetization fixing unit B11 (or the direction of the spin). In the example illustrated in FIG. 2, the direction M4 coincides with the negative direction of the X axis in the 3-dimensional coordinate system BC.

Any material may be used as a material of which the first magnetization fixing unit B11 is made as long as the material is a material of which the first ferromagnetic layer L1 can be made.

The structure of the first magnetization fixing unit B11 may be a synthetic structure formed by a ferromagnetic layer and a nonmagnetic layer or may be a synthetic structure formed by an antiferromagnetic layer, a ferromagnetic layer, and a nonmagnetic layer in order to fix magnetization. When the structure of the first magnetization fixing unit B11 is a synthetic structure formed by an antiferromagnetic layer, a ferromagnetic layer, and a nonmagnetic layer, a magnetization direction of the first magnetization fixing unit B11 is maintained more strongly by the antiferromagnetic layer. Therefore, in this case, the magnetization of the first magnetization fixing unit B11 is hardly influenced from the outside.

A second magnetization fixing unit B12 is provided in a lower side portion at the end on the magnetic region R2 side among ends of the magnetic recording layer L3. The above-described third electrode P3 is provided in a lower side portion of the second magnetization fixing unit B12. A lower side portion at the end on the magnetic region R2 among the ends of the magnetic recording layer L3 is an example of the third end of the first resistance change unit B1. That is, in the embodiment, the third electrode P3 is provided at the third end of the first resistance change unit B1 via the second magnetization fixing unit B12.

The second magnetization fixing unit B12 includes a ferromagnetic body. In the second magnetization fixing unit B12, a magnetization direction is fixed. A direction M5 indicated by an arrow illustrated in FIG. 2 is an example of a magnetization direction fixed in the second magnetization fixing unit B12. In the example illustrated in FIG. 2, the direction M5 coincides with the positive direction of the X axis in the 3-dimensional coordinate system BC.

Any material may be used as a material of which the second magnetization fixing unit B12 is made as long as the material is a material of which the first ferromagnetic layer L1 can be made.

The structure of the second magnetization fixing unit B12 may be a synthetic structure formed by a ferromagnetic layer and a nonmagnetic layer or may be a synthetic structure formed by an antiferromagnetic layer, a ferromagnetic layer, and a nonmagnetic layer in order to fix magnetization. When the structure of the second magnetization fixing unit B12 is a synthetic structure formed by an antiferromagnetic layer, a ferromagnetic layer, and a nonmagnetic layer, a magnetization direction of the second magnetization fixing unit B12 is maintained more strongly by the antiferromagnetic layer. Therefore, in this case, the magnetization of the second magnetization fixing unit B12 is hardly influenced from the outside.

The first magnetization fixing unit B11 is disposed between the magnetic recording layer L3 and the second electrode P2. Therefore, when a current is caused to flow from the second electrode P2 to the third electrode P3 via the first magnetization fixing unit B11 and the magnetic recording layer L3 in this order, spin polarized electrons flow in the same direction as the magnetization direction M4 of the first magnetization fixing unit B11 from the third electrode P3 to the second electrode P2 in the magnetic recording layer L3. Specifically, when the second power supply PS2 is applied voltage between the second electrode P2 and the third electrode P3 so that a potential of the third electrode P3 is lower than the potential of the ground to which the second electrode P2 is earthed, the electrons flow from the third electrode P3 to the second electrode P2 in the magnetic recording layer L3.

The second magnetization fixing unit B12 is disposed between the magnetic recording layer L3 and the third electrode P3. Therefore, when a current is caused to flow from the third electrode P3 to the second electrode P2 via the second magnetization fixing unit B12 and the magnetic recording layer L3 in this order, spin polarized electrons flow in the same direction as the magnetization direction M5 of the second magnetization fixing unit B12 from the second electrode P2 to the third electrode P3 in the magnetic recording layer L3. Specifically, when the second power supply PS2 is applied voltage between the second power supply PS2 and the third electrode P3 so that a potential of the third electrode P3 is higher than the potential of the ground to which the second electrode P2 is earthed, the electrons flow from the second electrode P2 to the third electrode P3 in the magnetic recording layer L3.

When the position of the domain wall DW in the magnetic recording layer L3 is moved, a ratio of a volume occupied by magnetic region R1 to a volume occupied by the magnetic region R2 is changed inside the magnetic recording layer L3. In the example illustrated in FIG. 2, the magnetization direction M1 of the first ferromagnetic layer L1 is the same direction as the magnetization direction M3 of the magnetic region R2 and is an opposite direction to the magnetization direction M2 of the magnetic region R1.

An area in which the first ferromagnetic layer L1 overlaps the magnetic region R2 when the first resistance change unit B1 is viewed in the negative direction of the Z axis in the 3-dimensional coordinate system BC is enlarged when the domain wall DW is moved in the positive direction of the X axis in the 3-dimensional coordinate system BC. As a result, in this case, a resistance value of the first magnetoresistance effect element 11 decreases by a magnetoresistance effect. That is, in this case, conductance of the first magnetoresistance effect element 11 increases. In contrast, the area is narrowed when the domain wall DW is moved in the negative direction of the X axis. As a result, in this case, the resistance value of the first magnetoresistance effect element 11 increases by the magnetoresistance effect. That is, in this case, the conductance of the first magnetoresistance effect element 11 decreases. The resistance value of the first magnetoresistance effect element 11 is a resistance value of the first resistance change unit B1 that behaves as a resistor with respect to a current flowing from the first electrode P1 to the second electrode P2 electrically connected to the first ferromagnetic layer L1.

A similar material to the first ferromagnetic layer L1 can be used as a ferromagnetic material of which the magnetic recording layer L3 is made. The magnetic recording layer L3 preferably has at least one element selected from the group consisting of Co, Ni, Pt, Pd, Gd, Tb, Mn, Ge, and Ga. When a vertical magnetization film is used as the magnetic recording layer L3, for example, a stacked film of Co and Ni, a stacked film of Co and Pt, a stacked film of Co and Pd, a MnGa-based material, a GdCo-based material, or a TbCo-based material can be exemplified as the ferromagnetic material of which the magnetic recording layer L3 is made. A ferromagnetic substance such as a MnGa-based material, a GdCo-based material, or a TbCo-based material has low saturation magnetization and can lower a threshold current necessary to move the domain wall DW. A stacked film of Co and Ni, a stacked film of Co and Pt, or a stacked film of Co and Pd has a large coercive force and can suppress a movement speed of the domain wall DW.

Here, as described above, in the first resistance change unit B1, the domain wall DW is moved when a current flows between the second electrode P2 and the third electrode P3. The current may be a current with a constant current value or may be a pulse current. Hereinafter, a case in which a pulse current with a constant pulse width is caused to flow between the second electrode P2 and the third electrode P3 by the second power supply PS2 will be described as an example.

That is, in this example, when the second power supply PS2 causes a pulse current to flow from the third electrode P3 to the second electrode P2, the magnetic region R1 spreads in the direction of the magnetic region R2. As a result, the domain wall DW is moved toward the magnetic region R2. In this example, on the other hand, when the second power supply PS2 causes a pulse current to flow from the second electrode P2 to the third electrode P3, the magnetic region R2 spreads in the direction of the magnetic region R1. As a result, the domain wall DW is moved toward the magnetic region R1.

In this way, in the first resistance change unit B1, by setting a direction of the pulse current flowing between the second electrode P2 and the third electrode P3 (that is, a direction of the pulse current flowing in the magnetic recording layer L3) and a magnitude of the pulse current, the position of the domain wall DW is controlled and a resistance value of the first magnetoresistance effect element 11 is changed.

The first magnetoresistance effect element 11 may be configured such that the domain wall DW is moved by applying an external magnetic field to the magnetic recording layer L3 in the longitudinal direction of the magnetic recording layer L3. In this case, the first magnetoresistance effect element 11 may not include the third electrode P3.

Figure 3:
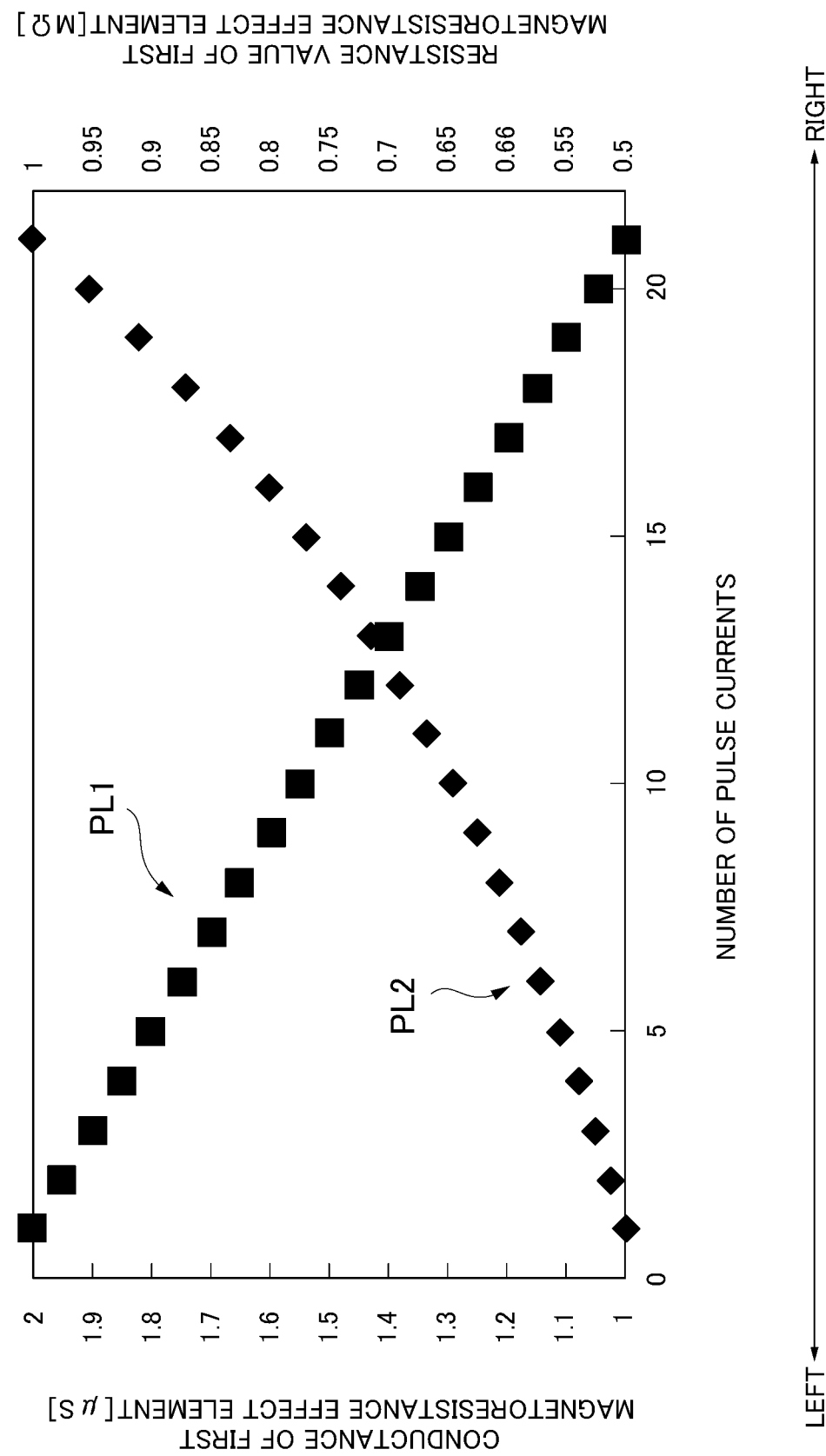
FIG. 3 is a diagram illustrating an example of a relation between the number of pulse currents flowing from a second electrode P2 to a third electrode P3 and each of a resistance value and conductance of a first resistance change unit B1 changed based on an increase in the number of pulse currents.

In this configuration, in the first resistance change unit B1, a resistance value is changed based on the number of pulse currents flowing between the second electrode P2 and the third electrode P3, as illustrated in FIG. 3. FIG. 3 is a diagram illustrating an example of a relation between the number of pulse currents flowing from a second electrode P2 to a third electrode P3 and each of a resistance value and conductance of a first resistance change unit B1 changed based on the increase in the number of pulse currents. FIG. 3 is a diagram illustrating the relation when a resistance value of the first resistance change unit B1 is changed within a range of 0.5 to 1.0 megaohms as an example. That is, the resistance value may be changed within a different range from this range. Arrows illustrated in FIG. 3 indicate right and left in the graph illustrated in FIG. 3.

The horizontal axis of the graph illustrated in FIG. 3 represents the number of pulse currents flowing from the third electrode P3 to the second electrode P2. The vertical axis on the left side of the graph represents conductance of the first resistance change unit B1. A plot PL1 on the graph indicates a change in the conductance of the first resistance change unit B1. The vertical axis on the right side of the graph represents a resistance value of the first resistance change unit B1. A plot PL2 on the graph indicates a change in the resistance value of the first resistance change unit B1.

Here, as indicated by the plot PL1, when the resistance value of the first resistance change unit B1 is changed within the range of 0.5 to 1.0 megaohms, the conductance of the first resistance change unit B1 is changed linearly with an increase in the number of pulse currents flowing from the third electrode P3 to the second electrode P2. In this case, the conductance is decreased without being increased with the increase in the number of pulse currents. As indicated by the plot PL1, in this case, the conductance of the first resistance change unit B1 is changed within a range of 1.0 to 2.0.

The first magnetoresistance effect element 11 has symmetry in a change in conductance. That is, in the first magnetoresistance effect element 11, an absolute value of a rate of change of conductance of the first field effect transistor 12 in the case of an increase from first conductance to second conductance accords with an absolute value of a rate of change of conductance of the first field effect transistor 12 in the case of a decrease from the second conductance to the first conductance except for a difference due to an error. Any conductance may be used as long as the first conductance is conductance equal to or greater than the minimum value of the conductance of the first field effect transistor 12 and less than the maximum value of the conductance. Any conductance may be used as long as the second conductance is conductance equal to or less than the maximum value and greater than the first conductance.

On the other hand, as indicated by the plot PL2, the resistance value of the first resistance change unit B1 nonlinearly increases with an increase in the number of pulse currents flowing from the third electrode P3 to the second electrode P2 when the resistance value of the first resistance change unit B1 is changed within the range of 0.5 to 1.0 megaohms. This is because the resistance value of the first resistance change unit B1 is a reciprocal of the conductance of the first resistance change unit B1. That is, the nonlinearity of the change in the resistance value is not nonlinearity based on a nonlinear function such as an exponential function. Therefore, in this case, the first resistance change unit B1 is considered to have approximate linearity to the change in the resistance value. This is apparent from the change in the plot PL2.

Since the first magnetoresistance effect element 11 has the symmetry in a change in conductance, the first magnetoresistance effect element 11 also has symmetry in a change in a resistance value.

In this way, in the memristor circuit 10, when the resistance value of the first resistance change unit B1 is changed within the range of 0.5 to 1.0 megaohms, the first resistance change unit B1 has linearity in a change in conductance and has approximate linearity in a change in a resistance value. In the memristor circuit 10, the first resistance change unit B1 has symmetry in a change in conductance and has symmetry in a change in a resistance value.

FIG. 1 is referred to back for description. The first field effect transistor 12 is, for example, a junction field effect transistor of a P channel. The first field effect transistor 12 may be a junction field effect transistor of an N channel, may be a compound type of field effect transistor, or may be a metal oxide semiconductor (MOS) field effect transistor.

A gate electrode G of the first field effect transistor 12 is connected to a transmission path between the first electrode P1 connected to the first power supply PS1 and the first power supply PS1 via a transmission path. A drain electrode D and a source electrode S of the first field effect transistor 12 are connected to other circuits via transmission paths. Here, hereinafter, to facilitate the description, application of a voltage between the gate electrode G and the ground to which the second electrode P2 is earthed is referred to as application of the voltage to the gate electrode G in the description. The other circuits may be any circuit as long as the circuits are circuits that cause a current to flow from the drain electrode D to the source electrode S based on a voltage applied to the gate electrode G when the voltage equal to or greater than pre-decided threshold is applied to the gate electrode G.

The control unit 20 is a processor. For example, the control unit 20 is a central processing unit (CPU). The control unit 20 may be another processor such as an application specific integrated circuit (ASIC) instead of a CPU. In FIG. 1, to facilitate the description, connection of the control unit 20, the other circuit elements, and other circuits via transmission paths is not illustrated.

The control unit 20 controls the first power supply PS1 such that a voltage is applied between the first electrode P1 and the second electrode P2 of the first magnetoresistance effect element 11. The control unit 20 controls the second power supply PS2 such that a voltage is applied between the second electrode P2 and the third electrode P3 of the first magnetoresistance effect element 11.

<Change in Conductance of Memristor Circuit>

Hereinafter, a change in conductance of the memristor circuit 10 will be described. The conductance of the memristor circuit 10 is conductance of the first field effect transistor 12 in the memristor control system 1. The conductance of the first field effect transistor 12 is defined as a reciprocal of a resistance value of the first field effect transistor 12 which is changed based on a voltage applied to the gate electrode G.

Figure 4:
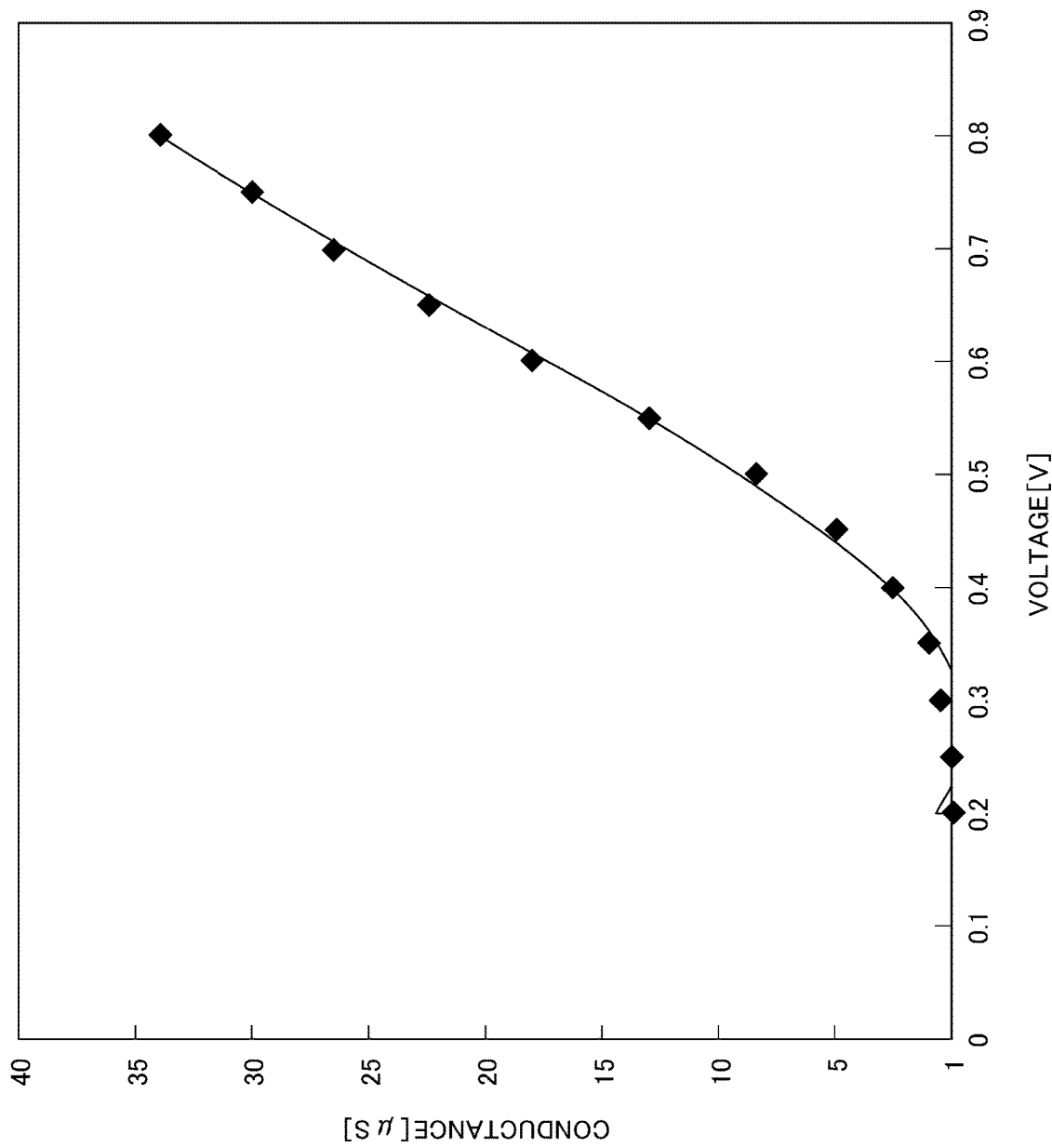
FIG. 4 is a diagram illustrating an example of a relation between a voltage applied to a gate electrode G and conductance of a first field effect transistor 12 changed based on the voltage.

FIG. 4 is a diagram illustrating an example of a relation between a voltage applied to the gate electrode G and conductance of the first field effect transistor 12 changed based on the voltage. The horizontal axis of the graph illustrated in FIG. 4 represents a voltage applied to the gate electrode G. The vertical axis of the graph represents conductance of the first field effect transistor 12.

In the example illustrated in FIG. 4, the conductance of the first field effect transistor 12 is linearly changed when a voltage applied to the gate electrode G is changed within a range of 0.5 to 1.0 volts. The voltage applied to the gate electrode G is changed based on a resistance value of the first magnetoresistance effect element 11. Therefore, when the voltage is linearly changed based on a change in the resistance value and the voltage applied to the gate electrode G is changed within the range of 0.5 to 1.0 volts, the memristor control system 1 can linearly change the conductance of the first field effect transistor 12 based on the change in the resistance value.

Here, when the resistance value of the first magnetoresistance effect element 11 is linearly changed, the voltage applied to the gate electrode G is linearly changed. As described above, when the resistance value of the first resistance change unit B1 is changed within the range of 0.5 to 1.0 megaohms, the resistance value of the first magnetoresistance effect element 11 is approximately linearly changed. That is, in the memristor control system 1, by changing the resistance value within the range, it is possible to approximately linearly change the voltage based on the change in the resistance value.

The range in which a resistance value of the first magnetoresistance effect element 11 (that is, the resistance value of the first resistance change unit B1) is changed can be adjusted based on the number of pulse currents flowing between the second electrode P2 and the third electrode P3 and the pulse width of the pulse current in the memristor control system 1. That is, the memristor control system 1 can change the resistance value of the first magnetoresistance effect element 11 within the range of 0.5 to 1.0 megaohms by adjusting the number of pulse currents and the pulse width.

As a result, the memristor control system 1 can approximately linearly changes the voltage applied to the gate electrode G based on the change in the resistance value of the first magnetoresistance effect element 11. Hereinafter, a case in which a range in which the resistance value of the first magnetoresistance effect element 11 is changed in the memristor control system 1 is 0.5 to 1.0 megaohms will be described as an example. In addition, hereinafter, a case in which the control unit 20 controls the first power supply PS1 such that the first power supply PS1 functions as a constant-current power supply will be described as an example.

A maximum value of the voltage applied to the gate electrode G is twice a minimum value of the voltage when the resistance value of the first magnetoresistance effect element 11 is changed within the range of 0.5 to 1.0 megaohms. In this case, the memristor control system 1 can changes the voltage applied to the gate electrode G within the range of 0.5 to 1.0 volts by adjusting the number of pulse currents flowing from the first power supply PS1 to the first electrode P1 of the first magnetoresistance effect element 11 and the pulse width of the pulse current. Accordingly, hereinafter, a case in which the range in which the voltage applied to the gate electrode G is changed in the memristor control system 1 is 0.5 to 1.0 volts will be described as an example.

As described above, the memristor control system 1 can approximately linearly change conductance of the first field effect transistor 12 (that is, conductance of the memristor circuit 10) based on a change in the resistance value of the first magnetoresistance effect element 11.

As described above, the first magnetoresistance effect element 11 has symmetric in the change in the resistance value. Therefore, in the memristor control system 1, an absolute value of a rate of change of a voltage in the case of an increase of the voltage applied to the gate electrode G from a first voltage to a second voltage accords with an absolute value of a rate of change of a voltage in the case of a decrease from the second voltage to the first voltage except for a difference due to an error. As a result, the first field effect transistor 12 (that is, the memristor circuit 10) has symmetry in a change in conductance. That is, in either case of an increase or a decrease in conductance, the conductance of the first field effect transistor 12 is changed along a curve plotted on a graph illustrated in FIG. 4.

As described above, in the memristor control system 1, the memristor circuit 10 can have substantially the same approximate linearity as the approximate linearity of the change in the resistance value of the first magnetoresistance effect element 11, and the symmetry in the change in the conductance of the memristor circuit 10.

The conductance of the first field effect transistor 12 is changed within a range of about 8.0 to 40 microsiemens when a voltage applied to the gate electrode G is changed within the range of 0.5 to 1.0 volts. A maximum rate of change of the conductance within the range is 500%. The maximum rate of change is a rate of change of the conductance when the conductance is changed from a minimum value to a maximum value within the range.

On the other hand, a maximum rate of change of the conductance of the first magnetoresistance effect element 11 illustrated in FIG. 3 is 200%. The maximum rate of change is a rate of change of the conductance when the conductance is changed from a minimum value (1.0 in the example illustrated in FIG. 3) to a maximum value (2.0 in the example illustrated in FIG. 3).

That is, since the memristor circuit 10 includes the first magnetoresistance effect element 11 and the first field effect transistor 12, a maximum rate of change of the conductance of the first magnetoresistance effect element 11 can be converted to be increased to a maximum rate of change of the conductance of the first field effect transistor 12. Thus, the memristor circuit 10 can easily detect a change in the conductance of the first magnetoresistance effect element 11 (a resistance value of the first magnetoresistance effect element 11) without using a charge detection method. The memristor circuit 10 can shorten a time necessary to detect the change in the conductance even when the charge detection method is used.

Further, as described above, in the memristor circuit 10, the first field effect transistor 12 has the approximate linearity and the symmetry in the change in the conductance of the first field effect transistor 12. That is, the memristor circuit 10 can increase a maximum rate of change of the conductance based on a current flowing in the first magnetoresistance effect element 11 while maintaining the approximate linearity and the symmetry of the first magnetoresistance effect element 11. In other words, the memristor circuit 10 can increase a maximum rate of change of the resistance value based on a current flowing in the first magnetoresistance effect element 11 while maintaining the approximate linearity and the symmetry. This is because the resistance value is a reciprocal of the conductance. The maximum rate of change is a rate of change of the resistance value when the resistance value is changed from the minimum value to the maximum value within the range of the resistance value of the memristor circuit 10 changed in the memristor control system 1. In the embodiment, the minimum value is 0.5 megaohms described above. In the embodiment, the maximum value is 1.0 megaohms described above.

As described above, a memristor circuit (in the embodiment, the memristor circuit 10) according to the embodiment includes: a first magnetoresistance effect element (in the embodiment, the first magnetoresistance effect element 11) including a first resistance change unit (in the embodiment, the first resistance change unit B1) configured to change a resistance value thereof based on a current flowing therein (in the embodiment, a current flowing between the second electrode P2 and the third electrode P3), a first electrode (in the embodiment, the first electrode P1) provided at a first end (in the embodiment, an upper side portion of the first ferromagnetic layer L1) of the first resistance change unit, and a second electrode (in the embodiment, the second electrode P2) provided at a second end (in the embodiment, a lower side portion of the end of the magnetic region R2 between ends of the magnetic recording layer L3) of the first resistance change unit; and a first field effect transistor (in the embodiment, the first field effect transistor 12) including a gate electrode (in the embodiment, the gate electrode G), the gate electrode being connected to a transmission path between the first electrode connected to a power supply (in the embodiment, the first power supply PS1) and the power supply. Accordingly, in the memristor circuit, the maximum rate of change of the conductance can be increased while maintaining the linearity and the symmetry in the change in the conductance.

<Modification Example 1 of Embodiment>

Figure 5:
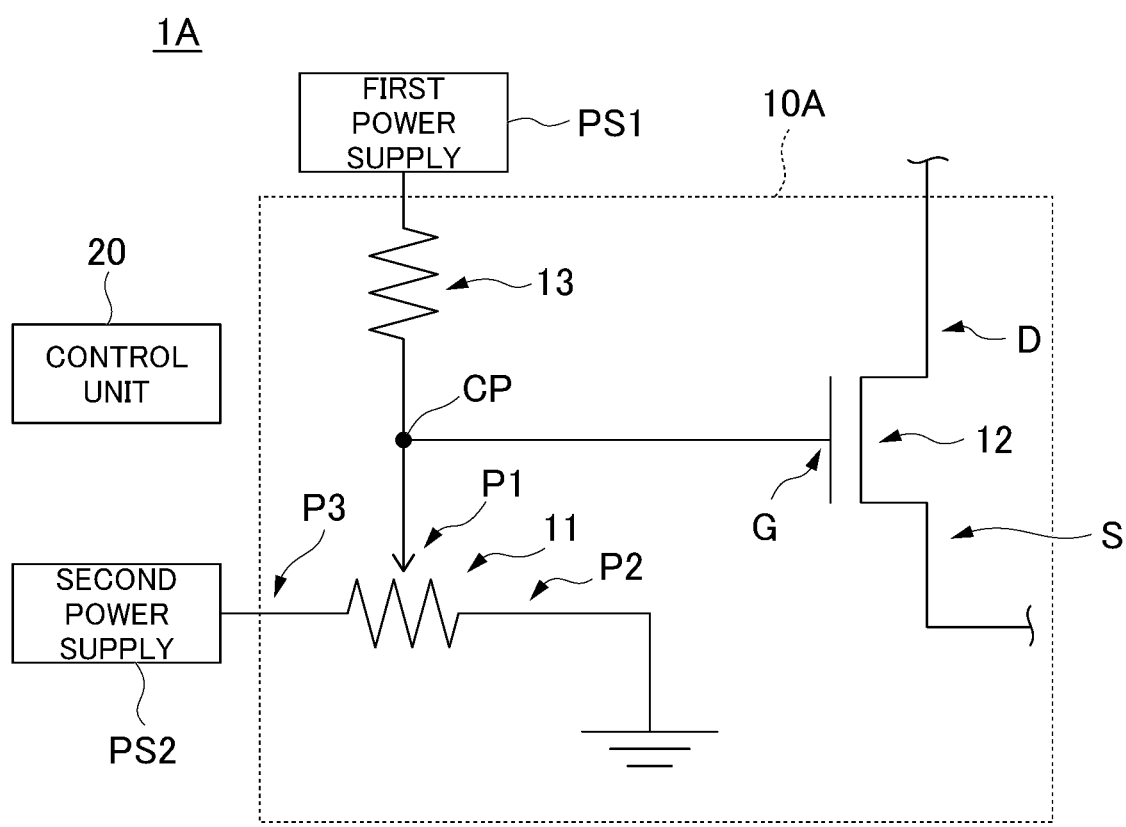
FIG. 5 is a diagram illustrating an example of a configuration of a memristor control system 1A according to Modification Example 1 of the embodiment.

Hereinafter, Modification Example 1 of the embodiment will be described with reference to FIG. 5. In Modification Example 1 of the embodiment, the same reference numerals are given to similar constituent units to those of the embodiment and description thereof will be omitted. FIG. 5 is a diagram illustrating an example of a configuration of a memristor control system 1A according to Modification Example 1 of the embodiment.

The memristor control system 1A includes a memristor circuit 10A and the control unit 20. The memristor circuit 10A includes the first magnetoresistance effect element 11, the first field effect transistor 12, and a resistor 13.

As illustrated in FIG. 5, the resistor 13 is connected between the first power supply PS1 and a contact point CP to the gate electrode G is connected in the transmission path between the first power supply PS1 and the first electrode P1. Thus, in the memristor control system 1A, the control unit 20 can control the first power supply PS1 such that the first power supply PS1 functions as a constant-voltage power supply instead of controlling the first power supply PS1 such that the first power supply PS1 functions as a constant-current power supply. That is, the memristor control system 1A can control the memristor circuit 10A through constant voltage control instead of constant current control. Hereinafter, a case in which a resistance value of the resistor 13 is 0.75 megaohms will be described as an example.

Here, a case in which the first power supply PS1 functions as a constant-voltage power supply applying a voltage of 1.0 volt between the first electrode P1 and the second electrode P2 and a resistance value of the first magnetoresistance effect element 11 is changed within the range of 0.5 to 1.0 megaohms will be considered as an example. In this case, as illustrated in FIG. 6, a voltage applied to the gate electrode G is changed within a range of approximate 0.4 to 0.6 volts with a change in the resistance value of the first magnetoresistance effect element 11 since the resistance value of the resistor 13 is 0.75 megaohms.

Figure 6:
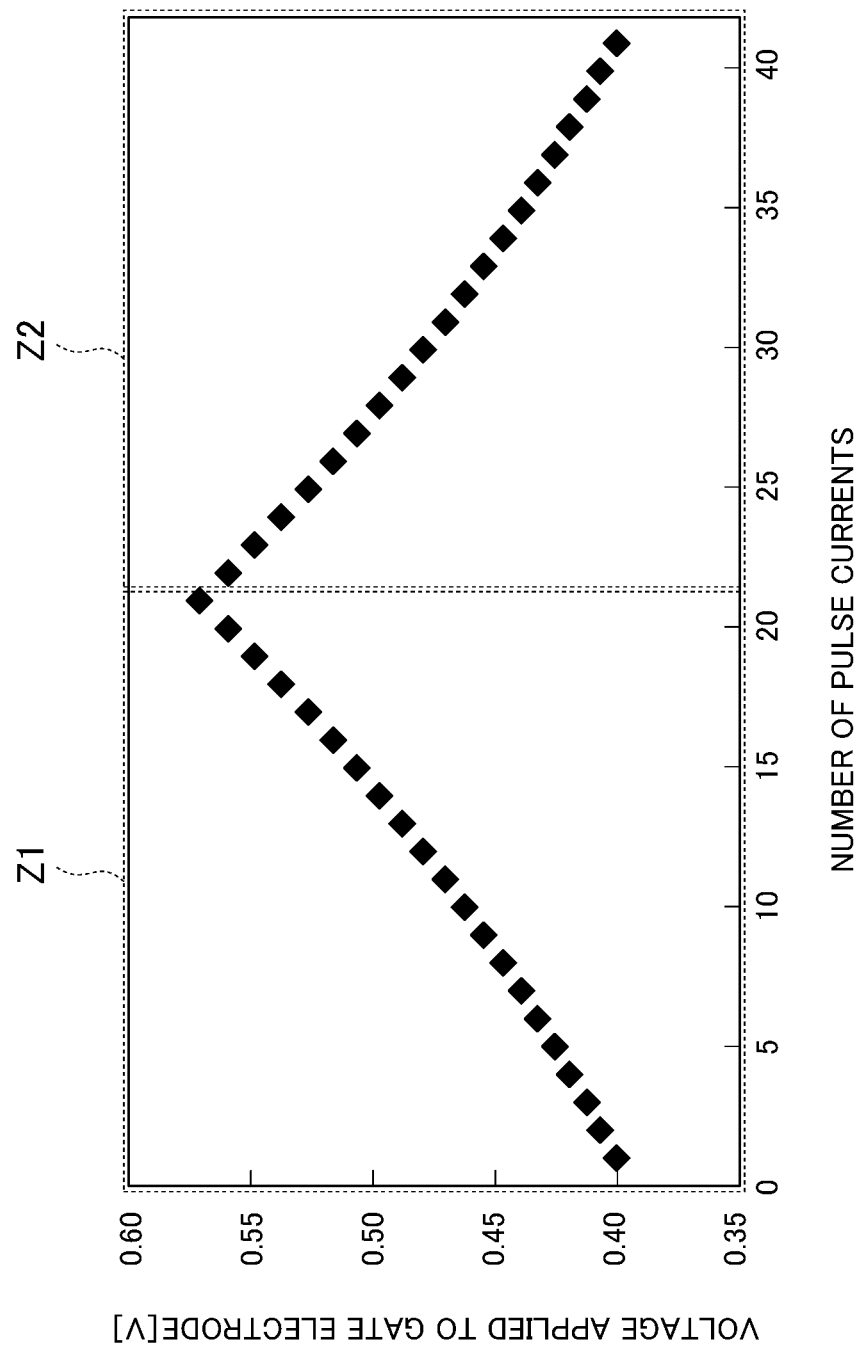
FIG. 6 is a diagram illustrating an example of a relation between the number of pulse currents flowing between the second electrode P2 and the third electrode P3 and a voltage applied to the gate electrode G based on the number of pulse currents.

FIG. 6 is a diagram illustrating an example of a relation between the number of pulse currents flowing between the second electrode P2 and the third electrode P3 and a voltage applied to the gate electrode G based on the number of pulse currents. The horizontal axis of the graph illustrated in FIG. 6 represents the number of pulse currents flowing between the second electrode P2 and the third electrode P3. The vertical axis of the graph represents a voltage applied to the gate electrode G.

Here, in a section Z1 in which the number of pulse currents in the graph illustrated in FIG. 6 is 1 to 21, the pulse currents flow from the third electrode P3 to the second electrode P2. In a section Z2 in which the number of pulse currents in the graph is 22 to 41, the pulse currents flow from the second electrode P2 to the third electrode P3. Therefore, in the graph, the trend of a change of the voltage applied to the gate electrode G is changed, at a certain voltage as a boundary, based on the number of pulse currents increases, from an increase to a decrease. The certain voltage as the boundary is that applied to the gate electrode G when the number of pulse currents is 21.

As illustrated in FIG. 6, an increase trend and a decrease trend in the voltage applied to the gate electrode G are represented by curves passing a point at which the number of pulse currents on the horizontal axis of the graph illustrated in FIG. 6 is 21 and are almost line-symmetric at a line parallel to the vertical axis of the graph as a boundary. This is because the first magnetoresistance effect element 11 has symmetry in the change in the resistance value, as described above.

On the other hand, as illustrated in FIG. 6, the voltage applied to the gate electrode G is not linearly changed in each of the sections Z1 and Z2. This is because a relation of a voltage dividing between fixed resistance and the first magnetoresistance effect element 11 is changed by the resistance value of the first magnetoresistance effect element 11 in addition to the non-linear change in the resistance value of the first magnetoresistance effect element 11, as described above. The reason is that a pulse width of each of the plurality of pulse currents flowing between the second electrode P2 and the third electrode P3 is mutually the same width. Thus, in the memristor control system 1A, the voltage applied to the gate electrode G can be linearly changed in each of the sections Z1 and Z2 by mutually changing the pulse width of each of some or all of the plurality of pulse currents flowing between the second electrode P2 and the third electrode P3. For example, in the memristor control system 1A, the voltage applied to the gate electrode G in the section Z1 can be linearly changed by shortening the pulse width of the pulse current based on the resistance value of the first magnetoresistance effect element 11 increases in the section Z1. In the memristor control system 1A, on the other hand, the voltage applied to the gate electrode G in the section Z2 can be linearly changed by lengthening the pulse width of the pulse current based on the resistance value of the first magnetoresistance effect element 11 decreases in the section Z2.

Such adjustment of the pulse width of the pulse current is performed by the control unit 20 in the memristor control system 1. Specifically, the control unit 20 changes the resistance value of the first resistance change unit B1, for example, by causing the pulse current of the pulse width to flow between the second electrode P2 and the third electrode P3 based on the resistance value of the first resistance change unit B1. In this case, the control unit 20 detects a resistance value by another circuit and acquires the detected resistance value.

Figure 7:
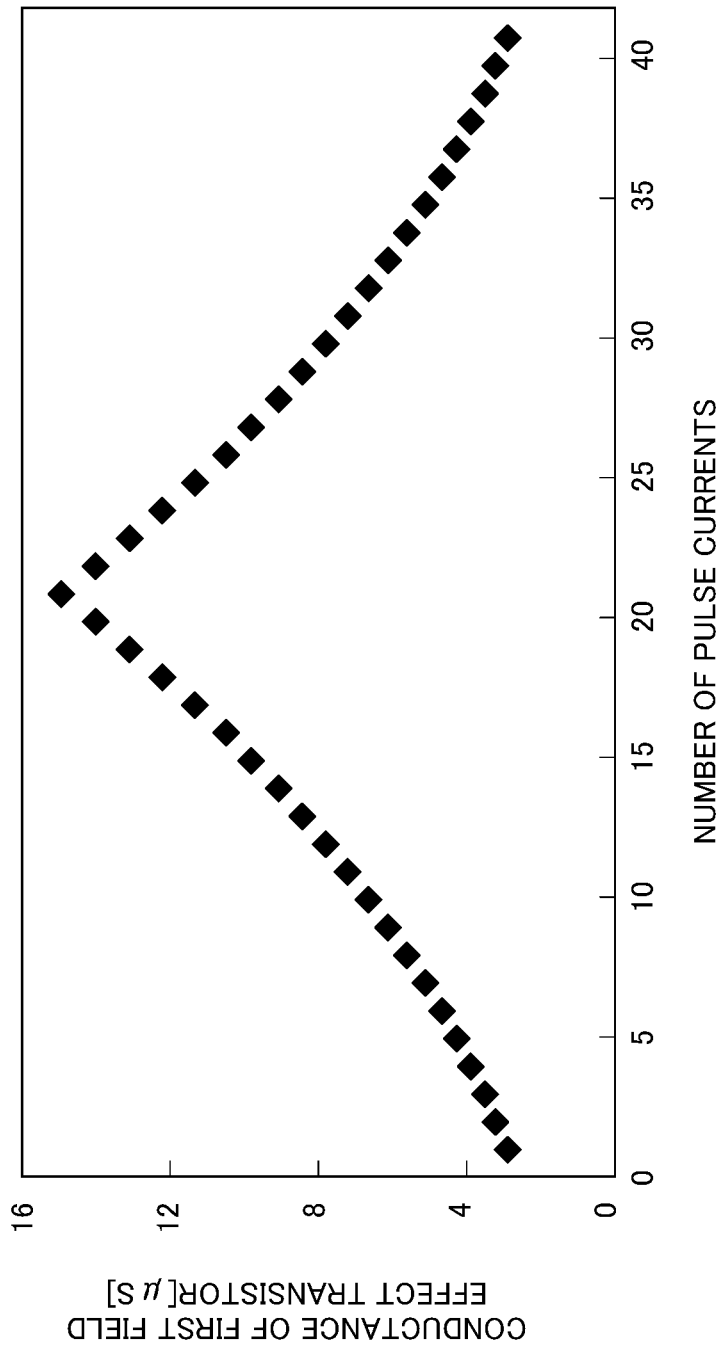
FIG. 7 is a diagram illustrating an example of a relation between the number of pulse currents flowing between the second electrode P2 and the third electrode P3 and conductance of the first field effect transistor 12 changed based on the number of pulse currents.

Here, when the voltage applied to the gate electrode G is changed, as illustrated in FIG. 6, the conductance of the first field effect transistor 12 is changed within a range of about 2.8 to 15 microsiemens based on the number of pulse currents flowing between the second electrode P2 and the third electrode P3, as illustrated in FIG. 7. FIG. 7 is a diagram illustrating an example of a relation between the number of pulse currents flowing between the second electrode P2 and the third electrode P3 and conductance of the first field effect transistor 12 changed based on the number of pulse currents. The horizontal axis of the graph illustrated in FIG. 7 is a similar horizontal axis as the horizontal axis of the graph illustrated in FIG. 6 and represents the number of pulse currents flowing between the second electrode P2 and the third electrode P3. The vertical axis of the graph represents conductance of the first field effect transistor 12.

When the conductance of the first field effect transistor 12 is changed within the range of about 2.8 to 15 microsiemens, a maximum rate of change of the conductance within this range is about 530%. The maximum rate of change is a rate of change of the conductance when the conductance within this range is changed from a minimum value to a maximum value. Thus, in the memristor circuit 10, it is possible to easily detect a change in conductance of the first magnetoresistance effect element 11 (or the resistance value of the first magnetoresistance effect element 11) without using a charge detection method. The memristor circuit 10 can shorten a time necessary to detect the conductance even when the charge detection method is used.

As illustrated in FIG. 7, an increase trend in the conductance of the first field effect transistor 12 and a decrease trend in the conductance of the first field effect transistor 12 are represented by straight lines passing a point at which the number of pulse currents on the horizontal axis of the graph illustrated in FIG. 7 is 21 and are almost line-symmetric at a line parallel to the vertical axis of the graph at a boundary. This is because the voltage applied to the gate electrode G is changed as illustrated in FIG. 6.

On the other hand, as illustrated in FIG. 7, the conductance of the first field effect transistor 12 is not changed linearly in each of a section of an increase and a section of a decrease. This is because the change in the voltage applied to the gate electrode G is not linearly changed in each of the sections Z1 and Z2, as illustrated in FIG. 6. Therefore, in the memristor control system 1, the conductance of the first field effect transistor 12 can be linearly changed in each of the sections of the increase and the decrease by mutually changing the pulse width of each of some or all of the plurality of pulse currents flowing between the second electrode P2 and the third electrode P3.

In the example illustrated in FIG. 7, a maximum rate of change of the conductance of the first field effect transistor 12 is about 530%, as described above. Thus, in the memristor circuit 10, the change in the resistance value of the first magnetoresistance effect element 11 can be easily detected without using a charge detection method.

As described above, a memristor circuit according to Modification Example 1 of the embodiment (in Modification Example 1 of the embodiment, the memristor circuit 10A) further includes a resistor (in Modification Example 1 of the embodiment, the resistor 13) connected between a power supply and a contact point (in Modification Example 1 of the embodiment, the contact point CP) to which a gate electrode (in Modification Example 1 of the embodiment, the gate electrode G) is connected in a transmission path between the power supply (in Modification Example 1 of the embodiment, the first power supply PS1) and a first electrode (in Modification Example 1 of the embodiment, the first electrode P1) in addition to the configuration of the memristor circuit 10 according to the embodiment. Thus, the memristor circuit can cause the power supply to function as a constant-voltage power supply and can increase the maximum rate of change of the resistance value while maintaining the linearity and symmetry in the change in the resistance value.

A memristor control system according to Modification Example 1 of the embodiment (in Modification Example 1 of the embodiment, the memristor control system 1A) includes the memristor circuit and a control unit (in Modification Example 1 of the embodiment, the control unit 20) configured to control the memristor circuit. The first magnetoresistance effect element (in Modification Example 1 of the embodiment, the first magnetoresistance effect element 11) is a domain wall movement magnetoresistance effect element. The first resistance change unit (in Modification Example 1 of the embodiment, the first resistance change unit B1) has a domain wall (in Modification Example 1 of the embodiment, the domain wall DW). A third electrode (in Modification Example 1 of the embodiment, the third electrode P3) is provided at the other end of the first resistance change unit (in Modification Example 1 of the embodiment, the lower side portion of the end on the magnetic region R1 between the ends of the magnetic recording layer L3) along with the second electrode (in Modification Example 1 of the embodiment, the second electrode P2). In the first resistance change unit, a resistance value is changed by movement of the domain wall based on a current flowing between the second and third electrodes. The control unit changes a resistance value of the first resistance change unit by causing a pulse current with a pulse width to flow based on a resistance value of the first resistance change unit between the second electrode and the third electrode. Thus, in the memristor control system 1, the maximum rate of change of the conductance can be caused to be large while more reliably maintaining the linearity and the symmetry in the change in the conductance.

<Modification Example 2 of Embodiment>

Figure 8:
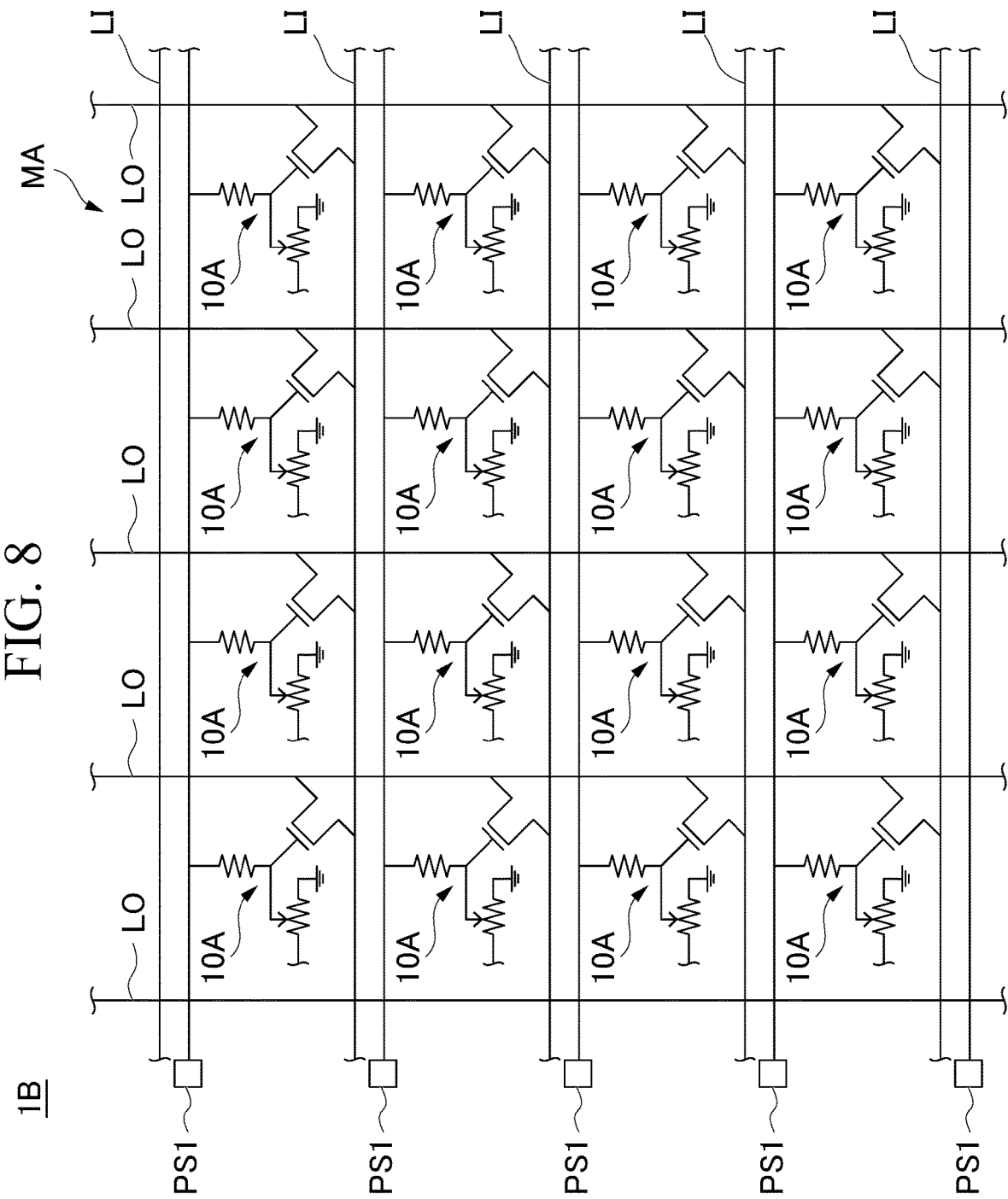
FIG. 8 is a diagram illustrating an example of a configuration of a memristor control system 1B according to Modification Example 2 of the embodiment.

Hereinafter, Modification Example 2 of the embodiment will be described with reference to FIG. 8. In Modification Example 2 of the embodiment, the same reference numerals are given to similar constituent units to those of the embodiment and Modification Example 1 of the embodiment and description thereof will be omitted. FIG. 8 is a diagram illustrating an example of a configuration of a memristor control system 1B according to Modification Example 2 of the embodiment.

The memristor control system 1B according to Modification Example 2 of the embodiment includes a memristor array MA including the plurality of memristor circuits 10A according to Modification Example 1 of the embodiment. In the memristor control system 1B, control of each memristor circuit 10 may be performed by one control unit 20 or the plurality of control units 20. In FIG. 8, the control unit 20 and the second power supply PS2 are omitted to facilitate the drawing.

In the example illustrated in FIG. 8, the memristor array MA includes 16 memristor circuits 10A disposed in a matrix form. The memristor array MA is, for example, a part of an analog product-sum operator configured as an integrated circuit. A neuromorphic device including such an analog product-sum operator (that is, a neuromorphic device including the memristor array MA) can perform calculation of a neural network in an analog manner.

For example, when a potential of a input transmission path LI illustrated in FIG. 8 is higher than a potential of an output transmission path LO and a voltage is applied between the first electrode P1 and the second electrode P2 of each memory cell from the first power supply PS1, a current flows from the input transmission path LI to the output transmission path LO in each memory cell. At this time, in each memory cell, a current with magnitude based on a product of a resistance value of the memory cell and magnitude of an input signal input to each input transmission path LI flows from the input transmission path LI to the output transmission path LO. Thus, in each memory cell, a process equivalent to weight multiplication in the neural network is performed. Then, the neuromorphic device including the memristor array MA can perform calculation of the neural network by adding the currents flowing from the input transmission paths LI to the output transmission paths LO in the memory cells.

The neuromorphic device including the memristor array MA can easily detect a change in the conductance of each memristor circuit 10A (or the resistance value of each memristor circuit 10A) without using a charge detection method and prevent a time necessary for calculation of the neural network from being long. The neuromorphic device can prevent the time necessary for the calculation from being long by shortening a time necessary to detect the conductance even when the charge detection method is used. The neuromorphic device can realize high durability and high reliability.

In the example illustrated in FIG. 8, the plurality of memristor circuits 10A are disposed on a 2-dimensional plane, but may be disposed 3-dimensionally instead. The memristor array MA may include only one memristor circuit 10A.

As described above, an analog product-sum operator according to Modification Example 2 of the embodiment (in Modification Example 2 of the embodiment, the analog product-sum operator including the memristor array MA) includes one memristor circuit or a plurality of memristor circuits (in Modification Example 2 of the embodiment, the memristor circuits 10A). Thus, for example, the memristor array can perform calculation of the neural network in an analog manner using each of the plurality of memristor circuits as a memory cell.

A neuromorphic device (in Modification Example 2 of the embodiment, the neuromorphic device including the memristor array MA) includes one memristor circuit or a plurality of memristor circuits (in Modification Example 2 of the embodiment, the memristor circuits 10A). Thus, for example, the neuromorphic device can perform calculation of the neural network in an analog manner using each of the plurality of memristor circuits as a memory cell.

<Modification Example 3 of Embodiment>

Hereinafter, Modification Example 3 of the embodiment will be described with reference to FIG. 9. In Modification Example 3 of the embodiment, the same reference numerals are given to similar constituent units to those of the embodiment and Modification Examples 1 and 2 and description thereof will be omitted.

Figure 9:
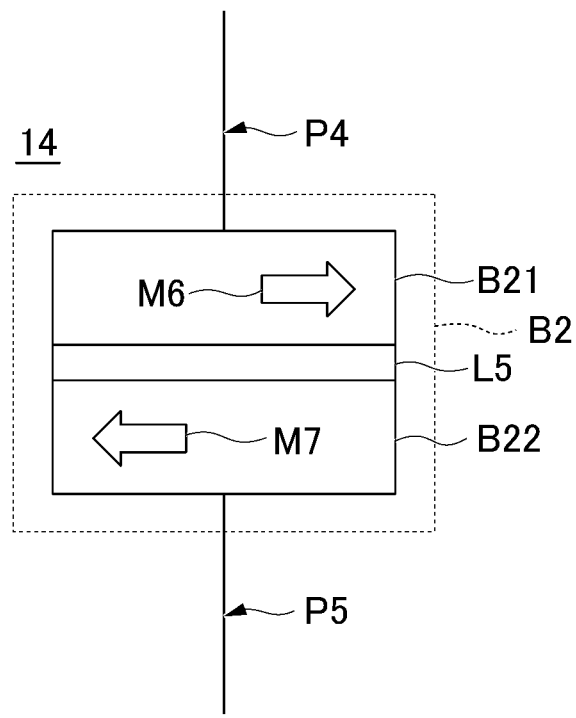
FIG. 9 is a diagram illustrating an example of a configuration of a second magnetoresistance effect element 14 according to Modification Example 3 of the embodiment.

In Modification Example 3 of the embodiment, the memristor circuit 10A according to Modification Example 1 of the embodiment or the memristor circuit 10A according to Modification Example 2 of the embodiment includes a second magnetoresistance effect element 14 illustrated in FIG. 9 instead of the resistor 13 according to Modification Examples 1 and 2 of the embodiment. FIG. 9 is a diagram illustrating an example of a configuration of the second magnetoresistance effect element 14 according to Modification Example 3 of the embodiment.

The second magnetoresistance effect element 14 includes a second resistance unit B2 of which a resistance value is changed based on a flowing current, an electrode P4 provided at a first end of the second resistance unit B2, and an electrode P5 provided at a second end of the second resistance unit B2. Here, a magnetization state of the second magnetoresistance effect element 14 is fixed. Here, the electrode P4 is connected to the first power supply PS1 via a transmission path. The electrode P5 is connected to a contact point CP via a transmission path.

The second resistance unit B2 has two ferromagnetic layers. In the second resistance unit B2, a magnetization relation between the two ferromagnetic layers is fixed. Thus, a resistance value of the second resistance unit B2 is fixed. Specifically, the second resistance unit B2 includes a third magnetization fixing unit B21, a nonmagnetic layer L5, and a fourth magnetization fixing unit B22.

In the second resistance unit B2, the third magnetization fixing unit B21 and the fourth magnetization fixing unit B22 are stacked with the nonmagnetic layer L5 interposed therebetween, as illustrated in FIG. 9. Hereinafter, to facilitate description, a side on which the third magnetization fixing unit B21 is located with respect to the fourth magnetization fixing unit B22 is referred to as an upper side and a side on which the fourth magnetization fixing unit B22 is located with respect to the third magnetization fixing unit B21 is referred to as a lower side in the description.

The third magnetization fixing unit B21 includes a ferromagnetic body. The third magnetization fixing unit B21 is one of the two ferromagnetic layers included in the second resistance unit B2. In the third magnetization fixing unit B21, a magnetization direction is fixed. A direction M6 indicated by an arrow illustrated in FIG. 9 is an example of a magnetization direction (or a direction of the spin) fixed in the third magnetization fixing unit B21. In the example illustrated in FIG. 9, the direction M6 is a direction perpendicular to the up and down directions.

In the example illustrated in FIG. 9, the electrode P4 is provided in an upper side portion of the third magnetization fixing unit B21. The upper side portion of the third magnetization fixing unit B21 is an example of the first end of the second resistance unit B2.

As a ferromagnetic material of which the third magnetization fixing unit B21 is made, a similar material to that of the first ferromagnetic layer L1 can be used. The ferromagnetic material of which the third magnetization fixing unit B21 is made may be a different ferromagnetic material from the ferromagnetic material of which the first ferromagnetic layer L1 is made among ferromagnetic materials of which the first ferromagnetic layer L1 is made.

As a material of which the nonmagnetic layer L5 is made, a similar material as that of the nonmagnetic layer L2 can be used. The material of which the nonmagnetic layer L5 is made may be a different material from the material of which the nonmagnetic layer L2 is made among materials of which the nonmagnetic layer L2 is made.

The fourth magnetization fixing unit B22 includes a ferromagnetic body. The fourth magnetization fixing unit B22 is the other of the two ferromagnetic layers included in the second resistance unit B2. In the fourth magnetization fixing unit B22, a magnetization direction is fixed. A direction M7 indicated by an arrow illustrated in FIG. 9 is an example of a magnetization direction fixed in the fourth magnetization fixing unit B22. In the example illustrated in FIG. 9, the direction M7 is an opposite direction to the direction M6. Instead of this, the direction M7 may be the same direction as the direction M6.

In the example illustrated in FIG. 9, the electrode P5 is provided in a lower side portion of the fourth magnetization fixing unit B22. The lower side portion of the fourth magnetization fixing unit B22 is an example of the second end of the second resistance unit B2.

As a ferromagnetic material of which the fourth magnetization fixing unit B22 is made, a similar material to that of the first ferromagnetic layer L1 can be used. The ferromagnetic material of which the fourth magnetization fixing unit B22 is made may be a different ferromagnetic material from the ferromagnetic material of which the first ferromagnetic layer L1 is made among ferromagnetic materials of which the first ferromagnetic layer L1 is made.

Here, when the resistance value of the resistor 13 according to Modification Examples 1 and 2 of the embodiment is set to be large, the length or thickness of the resistor 13 is large or thin in many cases. In these cases, the length and thickness of the resistor 13 are large and thin in many cases. As a result, the resistor 13 may be unstable and it is difficult to manufacture the resistor 13.

On the other hand, by adjusting the size of an element constituted from the third magnetization fixing unit B21 and the fourth magnetization fixing unit B22, it is possible to easily increase the resistance value of the second magnetoresistance effect element 14 according to Modification Example 3 of the embodiment. It is possible to easily manufacture each layer (that is, the third magnetization fixing unit B21, the nonmagnetic layer L5, and the fourth magnetization fixing unit B22) of the second magnetoresistance effect element 14 by stacking on the substrate along with each layer (that is, the first ferromagnetic layer L1, the nonmagnetic layer L2, and the magnetic recording layer L3) of the first magnetoresistance effect element 11. As a result, it is possible to prevent manufacturing cost of the memristor circuit 10A from increasing.

As described above, in the memristor circuit according to Modification Example 3 of the embodiment (in Modification Example 3 of the embodiment, the memristor circuit 10A), the resistor is a second magnetoresistance effect element (in Modification Example 3 of the embodiment, the second magnetoresistance effect element 14) that includes a second resistance unit (in Modification Example 3 of the embodiment, the second resistance unit B2) of which a resistance value is changed based on a flowing current, an electrode (in Modification Example 3 of the embodiment, the electrode P4) provided at the first end (in Modification Example 3 of the embodiment, the upper side portion of the third magnetization fixing unit B21) of the second resistance unit, and an electrode (in Modification Example 3 of the embodiment, the electrode P5) provided at a second end (in Modification Example 3 of the embodiment, the lower side portion of the fourth magnetization fixing unit B22) of the second resistance unit. The electrode provided at the first end of the second resistance unit is connected to a power supply (in Modification Example 3 of the embodiment, the first power supply PS1) and the electrode provided at the second end of the second resistance unit is connected to a contact point (in Modification Example 3 of the embodiment, the contact point CP). Thus, it is possible to prevent manufacturing cost of the memristor circuit from increasing.

<Modification Example 4 of Embodiment>

Hereinafter, Modification Example 4 of the embodiment will be described with reference to FIG. 10. In Modification Example 4 of the embodiment, the same reference numerals are given to similar constituent units to those of the embodiment and Modification Examples 1 to 3 of the embodiment and description thereof will be omitted. Here, hereinafter, to facilitate description, a plate-shaped member on which transmission paths, circuit elements, and the like are printed is referred to as a substrate in the description.

In Modification Example 4 of the embodiment, in the memristor circuit 10A according to Modification Example 3 of the embodiment, the first magnetoresistance effect element 11 is stacked on a substrate in a top pin structure. The top pin structure of the first magnetoresistance effect element 11 is a structure of elements in which the first ferromagnetic layer L1 with fixed magnetization is disposed on the front surface when viewed from the substrate side. FIG. 10 is a diagram illustrating an example of the memristor circuit 10A in which the first magnetoresistance effect element 11 is stacked on a substrate in the top pin structure. In FIG. 10, to clearly illustrate the structure of the memristor circuit 10A stacked on the substrate, members which are not included in the memristor circuit 10 among members stacked on the substrate are omitted. The members are, for example, various circuit elements, transmission paths, and the like stacked on the substrate.

Hereinafter, to facilitate description, of directions perpendicular to the substrate, a direction oriented from the substrate to each layer stacked on the substrate is referred to as an upper side. Of the directions perpendicular to the substrate, a direction oriented from each layer stacked on the substrate to the substrate is referred to as a lower side in the description. Arrows illustrated in FIG. 10 indicate upper and lower sides in FIG. 10.

Figure 10:
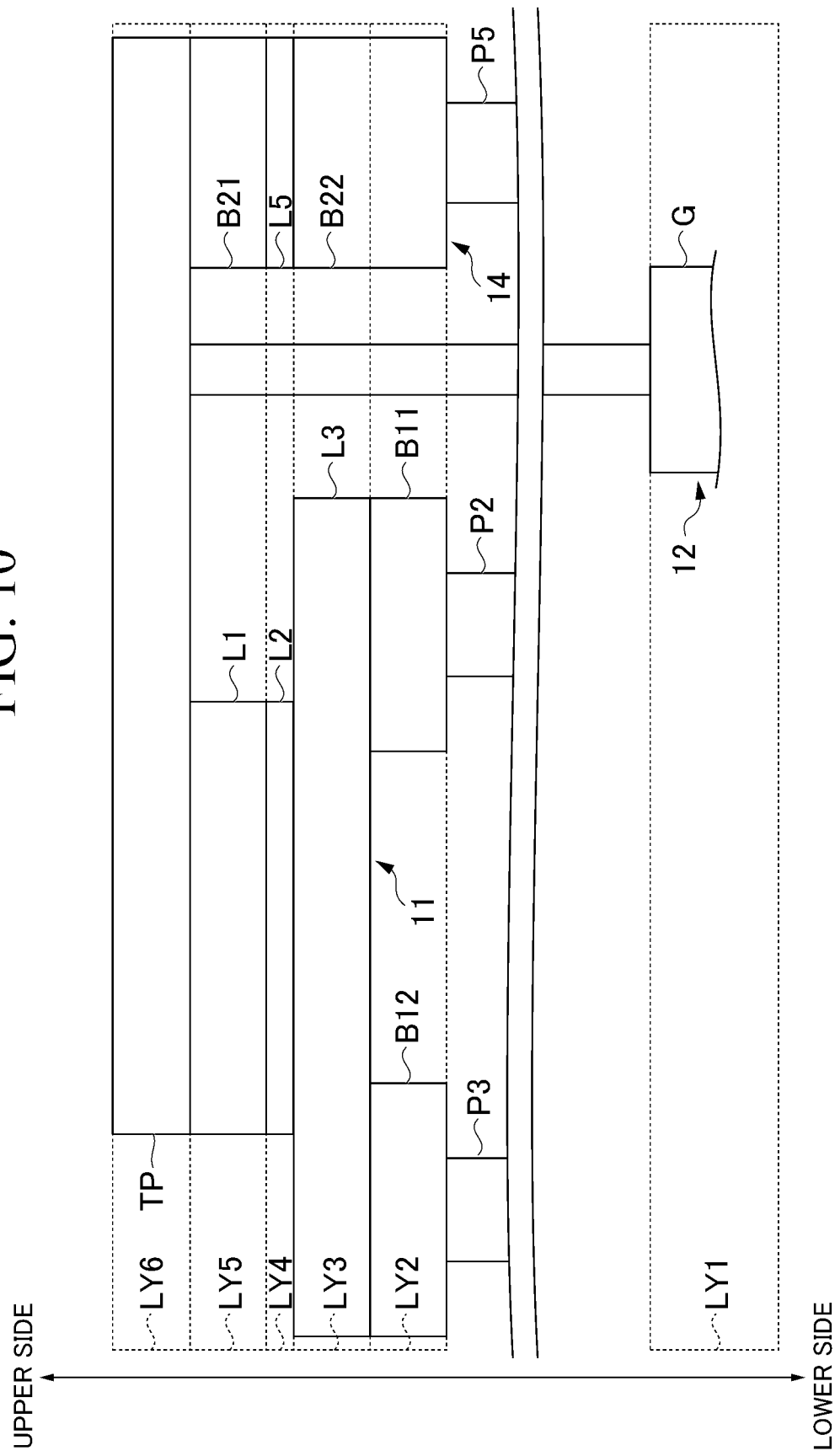
FIG. 10 is a diagram illustrating an example of a memristor circuit 10A in which the first magnetoresistance effect element 11 is stacked on a substrate in a top pin structure.

As illustrated in FIG. 10, in a first layer LY1 which is a layer closest to the substrate among the circuit elements included in the memristor circuit 10 on the substrate, the first field effect transistor 12 is provided so that the gate electrode G is located on the upper surface of the first layer LY1. The first layer LY1 may be directly printed on the upper surface of the substrate or may be printed on the upper surface of another layer printed on the upper surface of the substrate. Therefore, the substrate is omitted in FIG. 10.

On the substrate, a second layer LY2 in which the above-described first magnetization fixing unit B11, the above-described second magnetization fixing unit B12, and a part of the fourth magnetization fixing unit B22 included in the second magnetoresistance effect element 14 are provided is printed on the upper side of the first layer LY1. The second layer LY2 may be directly printed on the upper surface of the first layer LY1 or may be printed on the upper surface of another layer printed on the upper surface of the first layer LY1. In the example illustrated in FIG. 10, another layer is printed between the first layer LY1 and the second layer LY2. Therefore, in this example, the first layer LY1 is separate from the second layer LY2.

On the substrate, a third layer LY3 including the magnetic recording layer L3 included in the first magnetoresistance effect element 11 and a remaining part of the fourth magnetization fixing unit B22 included in the second magnetoresistance effect element 14 is directly printed on the upper surface of the second layer LY2. That is, the fourth magnetization fixing unit B22 is printed throughout two layers from the second layer LY2 to the third layer LY3.

On the substrate, a fourth layer LY4 including the nonmagnetic layer L2 included in the first magnetoresistance effect element 11 and the nonmagnetic layer L5 included in the second magnetoresistance effect element 14 is directly printed on the upper surface of the third layer LY3.

On the substrate, a fifth layer LY5 including the first ferromagnetic layer L1 included in the first magnetoresistance effect element 11 and the third magnetization fixing unit B21 included in the second magnetoresistance effect element 14 is directly printed on the upper surface of the fourth layer LY4.

On the substrate, a sixth layer LY6 including a transmission path TP in which the first electrode P1 included in the first magnetoresistance effect element 11, the electrode P4 included in the second magnetoresistance effect element 14, and a transmission path connecting the first electrode P1 to the electrode P4 are integrated is directly printed on the upper surface of the fifth layer LY5. Another layer may be printed on the upper surface of the sixth layer LY6 or another layer may not be printed.

On the substrate, the gate electrode G and a portion in which surfaces of the first ferromagnetic layer L1 and the third magnetization fixing unit B21 do not come into contact with each other among portions included in the transmission path TP are connected by a via.

On the substrate, the second electrode P2 is connected as a via to the first magnetization fixing unit B11. The second electrode P2 is earthed on the ground, as described above.

On the substrate, the third electrode P3 is connected as a via to the second magnetization fixing unit B12. The third electrode P3 is connected to the second power supply PS2 not illustrated in FIG. 10.

On the substrate, the electrode P5 is connected as a via to the fourth magnetization fixing unit B22. The electrode P5 is connected to the first power supply PS1 not illustrated in FIG. 10.

The first layer LY1 to the sixth layer LY6 are stacked from the lower side to the upper side in the order of the first layer LY1, the second layer LY2, the third layer LY3, the fourth layer LY4, the fifth layer LY5, and the sixth layer LY6 so that the configuration of the first magnetoresistance effect element 11 illustrated in FIG. 2 and the configuration of the second magnetoresistance effect element 14 illustrated in FIG. 9 are realized.

In this way, in the memristor circuit 10A in which the first magnetoresistance effect element 11 is stacked on the substrate by the top pin structure, the first ferromagnetic layer L1 is disposed on a layer distant more than the magnetic recording layer L3 from the substrate.

When the memristor circuit 10A is stacked on the substrate, the first magnetoresistance effect element 11 and the second magnetoresistance effect element 14 in the memristor circuit 10A can easily be manufactured by cutting the layers stacked on the substrate, forming the vias, and applying magnetic fields. That is, it is possible to prevent manufacturing cost of the memristor circuit 10A from increasing according to Modification Example 4 of the embodiment.

As described above, in the memristor circuit according to Modification Example 4 of the embodiment (in Modification Example 4 of the embodiment, the memristor circuit 10A including the second magnetoresistance effect element 14 according to Modification Example 3 of the embodiment), the first magnetoresistance effect element (in Modification Example 4 of the embodiment, the first magnetoresistance effect element 11) is stacked on the substrate by the top pin structure. In this way, it is possible to prevent manufacturing cost of the memristor circuit from increasing.

<Modification Example 5 of Embodiment>

Hereinafter, Modification Example 5 of the embodiment will be described with reference to FIG. 11. In Modification Example 4 of the embodiment, the same reference numerals are given to similar constituent units to those of the embodiment and Modification Examples 1 to 4 of the embodiment and description thereof will be omitted.

In Modification Example 5 of the embodiment, in the memristor circuit 10A according to Modification Example 3 of the embodiment, the first magnetoresistance effect element 11 is stacked on a substrate in a bottom pin structure. The bottom pin structure of the first magnetoresistance effect element 11 means a structure of elements in which the first ferromagnetic layer L1 with fixed magnetization is disposed the substrate side. FIG. 11 is a diagram illustrating an example of the memristor circuit 10A in which the first magnetoresistance effect element 11 is stacked on a substrate in a bottom pin structure.

Figure 11:
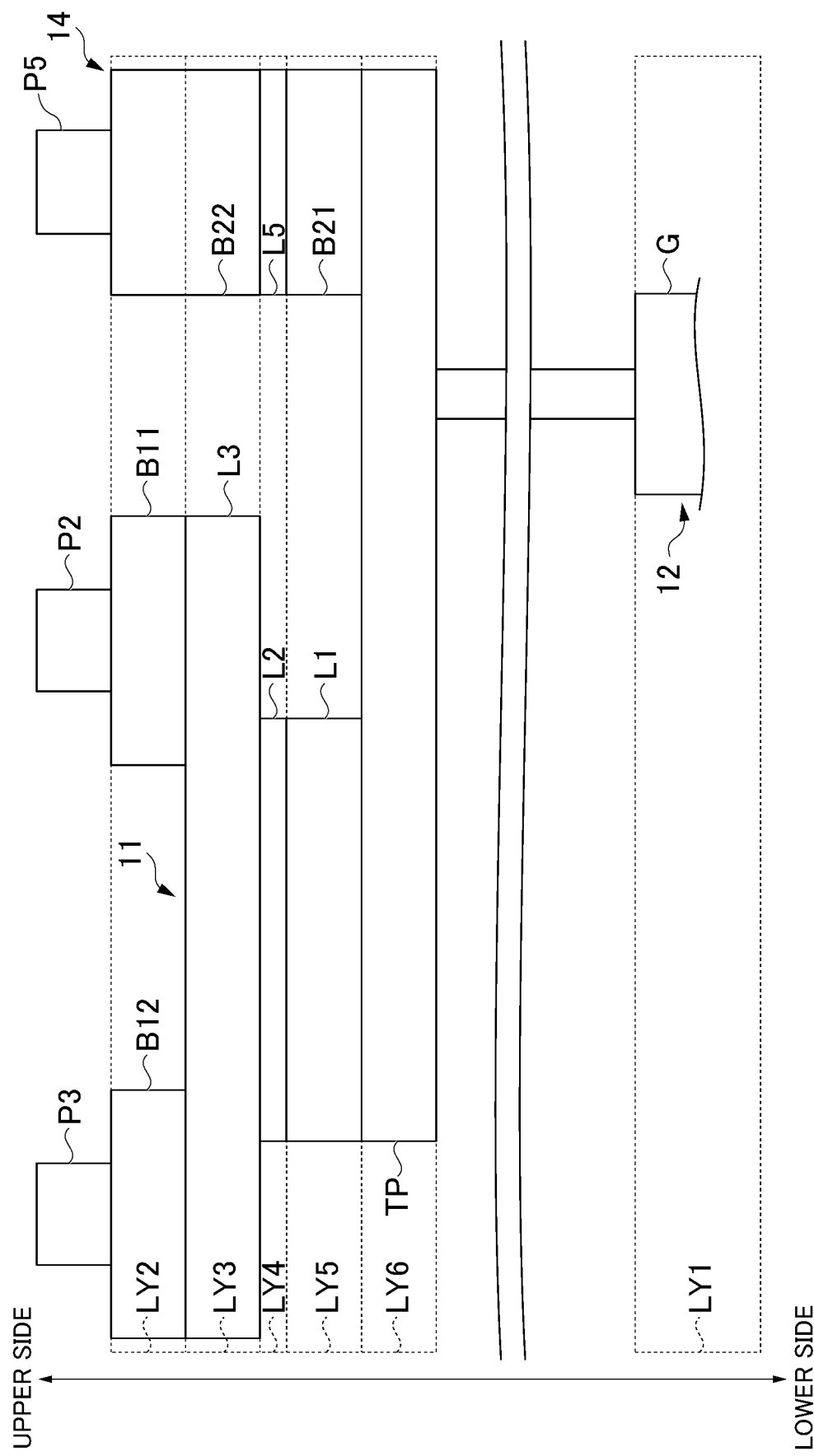
FIG. 11 is a diagram illustrating an example of the memristor circuit 10A in which the first magnetoresistance effect element 11 is stacked on a substrate in a bottom pin structure.

In FIG. 11, to clearly illustrate the structure of the memristor circuit 10A stacked on the substrate, members which are not included in the memristor circuit 10 among members stacked on the substrate are omitted. The members are, for example, various circuit elements, transmission paths, and the like stacked on the substrate.

Arrows illustrated in FIG. 11 indicate upper and lower sides in FIG. 11.

As illustrated in FIG. 11, on the substrate, the sixth LY6 is printed on the upper side of the first layer LY1. The sixth layer LY6 may be directly printed on the upper surface of the first layer LY1 or may be printed on the upper surface of another layer printed on the upper surface of the first layer LY1. In the example illustrated in FIG. 11, another layer is printed between the first layer LY1 and the sixth layer LY6. Therefore, in this example, the first layer LY1 is separate from the sixth layer LY6.

On the substrate, the fifth layer LY5 is directly printed on the upper surface of the sixth layer LY6.

On the substrate, the fourth layer LY4 is directly printed on the upper surface of the fifth layer LY5.

On the substrate, the third layer LY3 is directly printed on the upper surface of the fourth layer LY4.

On the substrate, the second layer LY2 is directly printed on the upper surface of the third layer LY3. Another layer may be printed on the upper surface of the second layer LY2 or another layer may not be printed.

On the substrate, the gate electrode G and a portion in which surfaces of the first ferromagnetic layer L1 and the third magnetization fixing unit B21 do not come into contact with each other among portions included in the transmission path TP are connected by a via.

On the substrate, the second electrode P2 is connected as a via to the first magnetization fixing unit B11. The second electrode P2 is earthed on the ground, as described above.

On the substrate, the third electrode P3 is connected as a via to the second magnetization fixing unit B12. The third electrode P3 is connected to the second power supply PS2 not illustrated in FIG. 11.

On the substrate, the electrode P5 is connected as a via to the fourth magnetization fixing unit B22. The electrode P5 is connected to the first power supply PS1 not illustrated in FIG. 11.

The first layer LY1 to the sixth layer LY6 are stacked from the lower side to the upper side in the order of the first layer LY1, the sixth layer LY6, the fifth layer LY5, the fourth layer LY4, the third layer LY3, the second layer LY2, and so that the configuration of the first magnetoresistance effect element 11 illustrated in FIG. 2 and the configuration of the second magnetoresistance effect element 14 illustrated in FIG. 9 are realized.

In this way, in the memristor circuit 10A in which the first magnetoresistance effect element 11 is stacked on the substrate by the bottom pin structure, the first ferromagnetic layer L1 is disposed on a layer closer than the magnetic recording layer L3 from the substrate.

When the memristor circuit 10A is stacked on the substrate, the first magnetoresistance effect element 11 and the second magnetoresistance effect element 14 in the memristor circuit 10A can easily be manufactured by cutting the layers stacked on the substrate, forming the vias, and applying magnetic fields. That is, it is possible to prevent manufacturing cost of the memristor circuit 10A from increasing according to Modification Example 5 of the embodiment.

As described above, in the memristor circuit according to Modification Example 5 of the embodiment (in Modification Example 5 of the embodiment, the memristor circuit 10A including the second magnetoresistance effect element 14 according to Modification Example 3 of the embodiment), the first magnetoresistance effect element (in Modification Example 5 of the embodiment, the first magnetoresistance effect element 11) is stacked on the substrate by the bottom pin structure. In this way, it is possible to prevent manufacturing cost of the memristor circuit from increasing.

<Modification Example 6 of Embodiment>

Hereinafter, Modification Example 6 of the embodiment will be described. In Modification Example 6 of the embodiment, the same reference numerals are given to similar constituent units to those of the embodiment and Modification Examples 1 to 5 of the embodiment and description thereof will be omitted.

In Modification Example 6 of the embodiment, in the memristor circuit 10 or the memristor circuit 10A, a switching element is connected between the first power supply PS1 and the gate electrode G. The switching element is, for example, a bi-polar transistor or a field effect transistor, but may be another switching element.

When the switching element is connected between the first power supply PS1 and the gate electrode G, each of the memristor control system 1, the memristor control system 1A, and the memristor control system 1B can switch whether to apply a voltage to the gate electrode G based on a timing desired by a user. As a result, for example, in this case, a neuromorphic device including the memristor array MA can easily switch between conduction (ON state) and non-conduction (OFF state) between a source electrode S and a drain electrode D of each of the plurality of first field effect transistors 12 included in the memristor array MA at the time of back propagation. That is, the memristor array MA can selectively conduct the source electrode S to the drain electrode D of each of one or more first field effect transistors 12 desired by the user among the plurality of first field effect transistors 12 included in the memristor array MA.

The memristor circuit 10 or the memristor circuit 10A may be configured such that the above-described switching element is connected between the second power supply PS2 and the third electrode P3. In this case, each of the memristor control system 1, the memristor control system 1A, and the memristor control system 1B can prevent a pulse current from flowing between the second electrode P2 and the third electrode P3 at a timing which is not intended by the user. As a result, for example, in which case, the neuromorphic device including the memristor array MA can prevent a pulse current from flowing between the second electrode P2 and the third electrode P3 of each of one or more first magnetoresistance effect elements 11 which is not desired by the user among the plurality of first magnetoresistance effect elements 11 included in the memristor array MA due to an erroneous operation or the like.

As described above, in the memristor circuit according to Modification Example 6 of the embodiment (in Modification Example 6 of the embodiment, the memristor circuit 10 or the memristor circuit 10A), the switching element (in Modification Example 6 of the embodiment, a bi-polar transistor, a field effect transistor, or the like) is connected between a power supply (in Modification Example 6 of the embodiment, the first power supply PS1) and the gate electrode (in Modification Example 6 of the embodiment, the gate electrode G). Thus, the memristor circuit can switch whether to apply a voltage to the gate electrode based on a timing desired by the user.

<Modification Example 7 of Embodiment>

Hereinafter, Modification Example 7 of the embodiment will be described. In Modification Example 7 of the embodiment, the same reference numerals are given to similar constituent units to those of the embodiment and Modification Examples 1 to 6 of the embodiment and description thereof will be omitted. Hereinafter, to facilitate description, a resistance value of the resistor 13 or the second magnetoresistance effect element 14 is referred to as a reference resistance value in the description. Hereinafter, a case in which a minimum value of the resistance value of the first magnetoresistance effect element 11 is 0.5 megaohms, a maximum value of the resistance value is 1.0 megaohm, and a voltage supplied from the first power supply PS1 is 1.0 volt will be described as an example.

In Modification Example 7 of the embodiment, the reference resistance value falls within a range between a minimum value of a resistance value of the first magnetoresistance effect element 11 (that is, a resistance value of the first resistance change unit B1) and a maximum value of the resistance value.

Figure 12:
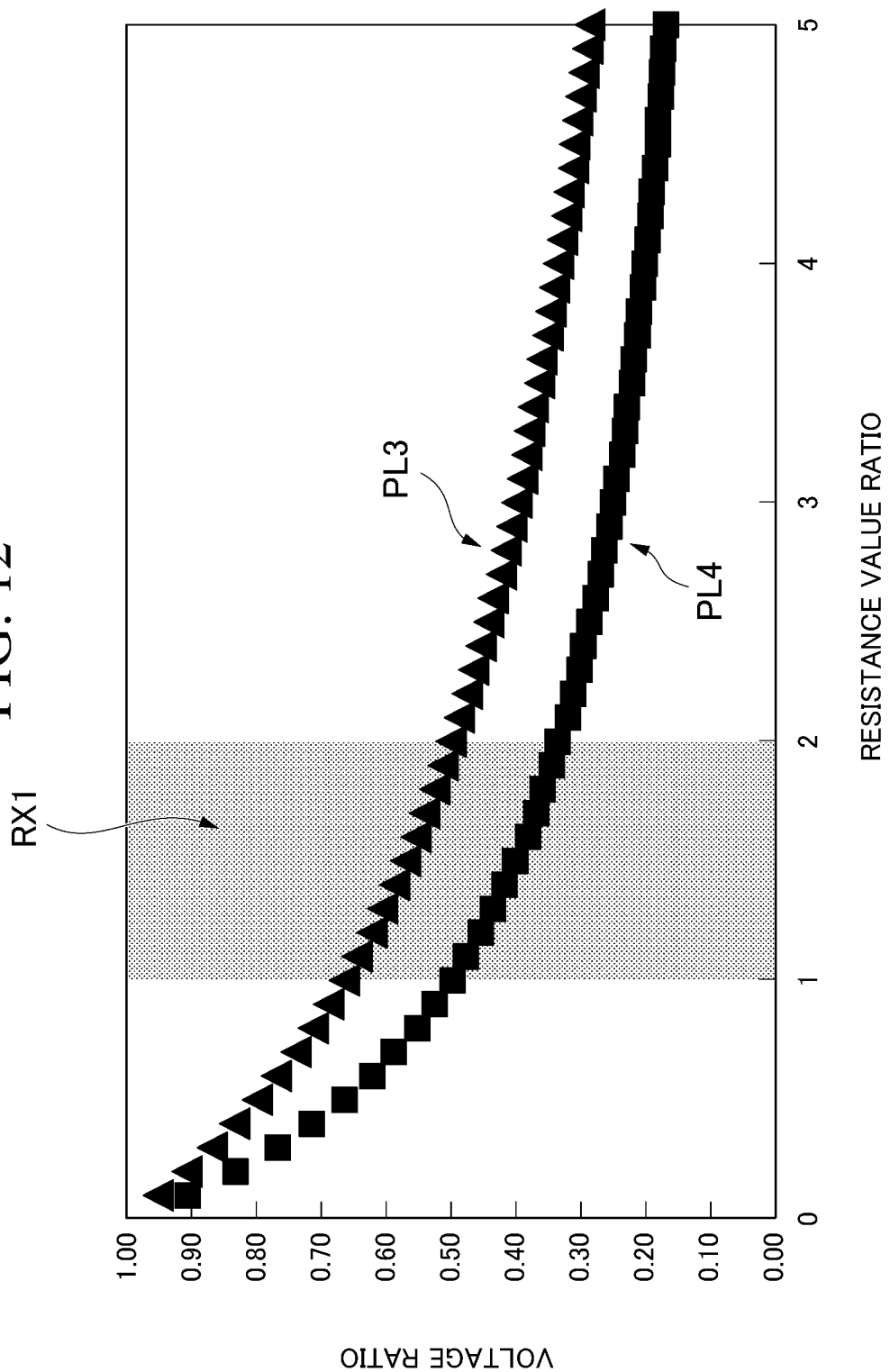
FIG. 12 is a diagram illustrating an example of a relation between a change in a reference resistance value and a change in a maximum or minimum voltage (normalized with a power supply voltage) applied to the gate electrode G.

Here, for example, as the reference resistance value is less than the minimum value of the resistance value of the first magnetoresistance effect element 11, a voltage applied to the first magnetoresistance effect element 11 increases. As a result, a voltage applied to the gate electrode G increases. On the other hand, as the reference resistance value is less than the minimum value of the resistance value of the first magnetoresistance effect element 11, a maximum rate of change of end-to-end voltage decreases based on a change in the resistance value. The maximum rate of change is a rate of change of a voltage when the voltage is changed from the minimum value to the maximum value within a change range of the voltage based on the change in the resistance value. As a result, the maximum rate of change of the voltage applied to the gate electrode G decreases, as illustrated in FIG. 12. In this case, in the memristor circuit 10 or the memristor circuit 10A, a maximum rate of change of conductance of the first field effect transistor 12 in constant voltage control may be magnitude which is the same as or equal to or less than a maximum range of change of conductance of the first magnetoresistance effect element 11.

FIG. 12 is a diagram illustrating an example of a relation between a change in a reference resistance value and a change in a voltage applied to the gate electrode G. The horizontal axis of the graph illustrated in FIG. 12 represents a value (normalized value) obtained by dividing the reference resistance value by a minimum value of the resistance value of the first magnetoresistance effect element 11. Hereinafter, to facilitate description, this value is referred to as a resistance value ratio in the description. That is, on the horizontal axis, the larger the resistance value ratio means the larger the magnitude of the reference resistance value. The vertical axis of the graph illustrated in FIG. 12 represents a value (normalized value) obtained by dividing the voltage applied to the gate electrode G by a voltage supplied from the first power supply PS1. Hereinafter, to facilitate description, this value is referred to as a voltage ratio in the description. That is, on the vertical axis, the larger the voltage ratio means the larger the voltage applied to the gate electrode G.

A region RX1 illustrated in FIG. 12 is an example of a region in which the reference resistance value falls within a range from a resistance value ratio when the reference resistance value is the minimum value to a resistance value ratio when the reference resistance value is the maximum value in a region of the graph illustrated in FIG. 12. A plot PL3 illustrated in FIG. 12 is a plot indicating a change in a voltage ratio based on a change in the reference resistance value when the resistance value of the first magnetoresistance effect element 11 is the maximum. A plot PL4 illustrated in FIG. 12 indicates a change in a voltage ratio based on a change in the reference resistance value when the resistance value of the first magnetoresistance effect element 11 is the minimum.

In the graph illustrated in FIG. 12, each of the plots PL3 and PL4 increases as the resistance value ratio is less than a value included in the region RX1 on the horizontal axis of the graph. This indicates that the voltage applied to the gate electrode G increases as the reference resistance value is less than the minimum value of the resistance value of the first magnetoresistance effect element 11. However, in the graph, each of the plots PL3 and PL4 approaches as the resistance value ratio is less than a value included in the region RX1 on the horizontal axis of the graph. This indicates that the maximum rate of change of the voltage applied to the gate electrode G decreases as the reference resistance value is less than the minimum value of the resistance value of the first magnetoresistance effect element 11.

Figure 13:
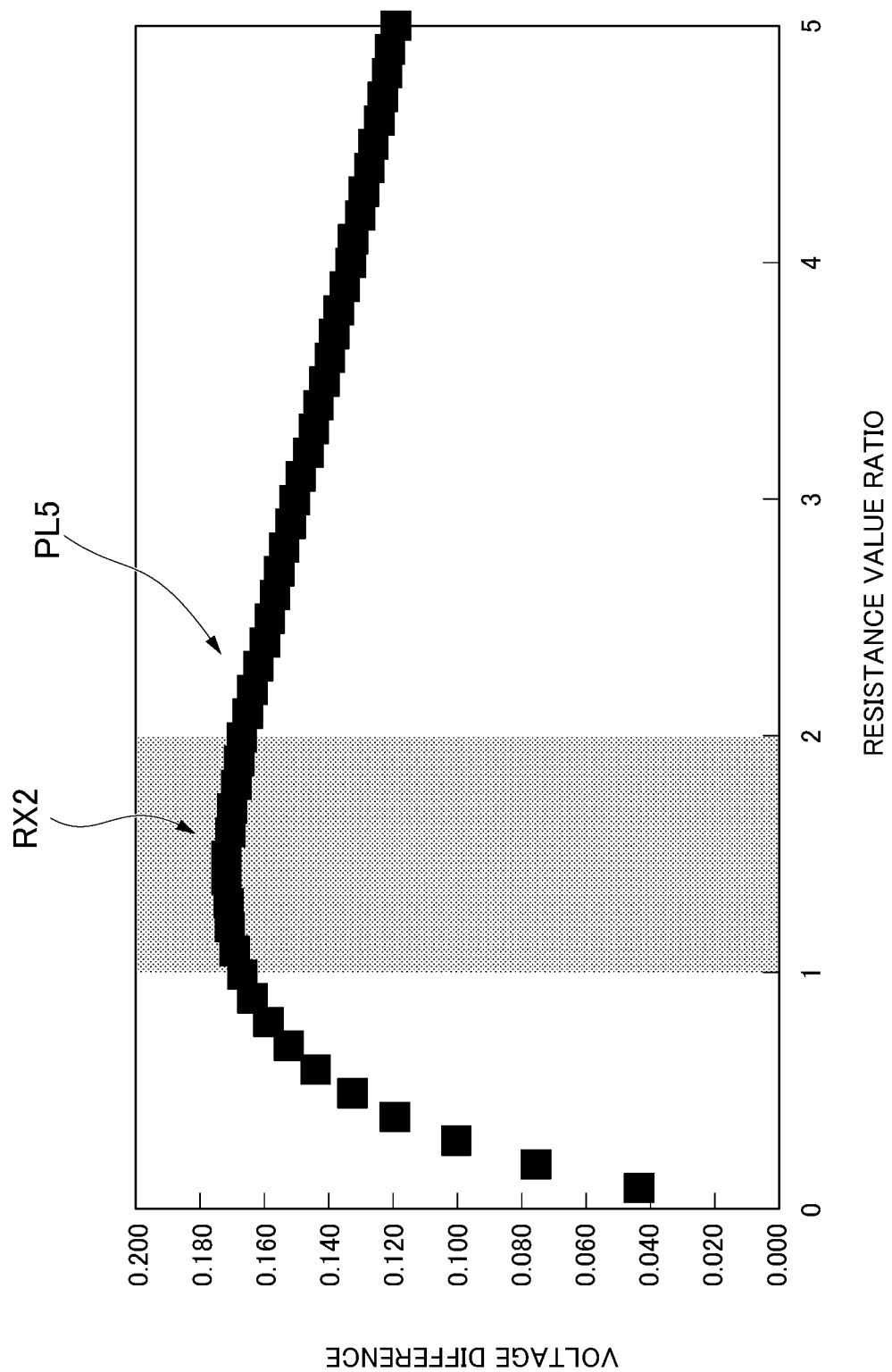
FIG. 13 is a diagram illustrating an example of a relation between a change in the reference resistance value and a change in a difference between the maximum and minimum voltages (normalized with a power supply voltage) applied to the gate electrode G.

FIG. 13 is a diagram illustrating an example of a relation between a change in a voltage difference and a change in a voltage applied to the gate electrode G. Here, a voltage difference is a value obtained by subtracting the voltage applied to the gate electrode G when the resistance value of the first magnetoresistance effect element 11 is the minimum value from the voltage applied to the gate electrode G when the resistance value of the first magnetoresistance effect element 11 is the maximum value. The horizontal axis of the graph illustrated in FIG. 13 represents a resistance value ratio. The vertical axis of the graph illustrated in FIG. 13 represents the voltage difference. That is, on the vertical axis, the larger the voltage difference means the larger the maximum rate of change of the voltage applied to the gate electrode G.

A region RX2 illustrated in FIG. 13 is an example of a region in which the reference resistance value falls within a range from a resistance value ratio when the reference resistance value is the minimum value to a resistance value ratio when the reference resistance value is the maximum value in a region of the graph illustrated in FIG. 13. A plot PL5 illustrated in FIG. 13 is a plot indicating a change in a voltage difference based on a change in the reference resistance value.

In the graph illustrated in FIG. 13, the plots PL5 decreases as the resistance value ratio is less than a value included in the region RX2 on the horizontal axis of the graph. This indicates that the maximum rate of change of the voltage applied to the gate electrode G decreases as the reference resistance value is less than the minimum value of the resistance value of the first magnetoresistance effect element 11.

As illustrated in FIGS. 12 and 13, the maximum rate of change of the voltage applied to the gate electrode G decreases as the reference resistance value is less than the minimum value of the resistance value of the first magnetoresistance effect element 11. As a result, in the memristor circuit 10 or the memristor circuit 10A, a maximum rate of change of conductance of the first field effect transistor 12 in constant voltage control may be magnitude which is the same or equal to or less than a maximum range of change of conductance of the first magnetoresistance effect element 11.

That is, in this case, in the memristor circuit 10 or the memristor circuit 10A, an amplification factor of the conductance of the first magnetoresistance effect element 11 by the first field effect transistor 12 may be less than when the resistance value ratio is included in the region RX1 or RX2.

For example, the voltage applied to the first magnetoresistance effect element 11 decreases as the reference resistance value is greater than the maximum value of the resistance value of the first magnetoresistance effect element 11. As a result, the voltage applied to the gate electrode G decreases. In this case, even when the maximum rate of change of the voltage applied to the gate electrode G increases, magnitude of the conductance of the first field effect transistor 12 does not increase in the constant voltage control in the memristor circuit 10 or the memristor circuit 10A, compared to the case in which the resistance value ratio is included in the region RX1 or RX2. That is, in this case, in the memristor circuit 10 or the memristor circuit 10A, an amplification factor of the conductance of the first magnetoresistance effect element 11 by the first field effect transistor 12 may decrease, compared to the case in which the resistance value ratio is included in the region RX1 or RX2.

In the graph illustrated in FIG. 12, each of the plots PL3 and PL4 decreases as the resistance value ratio is greater than the value included in the region RX1 on the horizontal axis of the graph. This indicates that the voltage applied to the gate electrode G decreases as the reference resistance value is greater than the maximum value of the resistance value of the first magnetoresistance effect element 11. In the graph, each of the plots PL3 and PL4 approaches as the resistance value ratio is greater than a value included in the region RX1 on the horizontal axis of the graph. This indicates that the maximum rate of change of the voltage applied to the gate electrode G decreases as the reference resistance value is greater than the maximum value of the resistance value of the first magnetoresistance effect element 11.

In the graph illustrated in FIG. 13, the plot PL5 decreases as the resistance value ratio is greater than the value included in the region RX2 on the horizontal axis of the graph. This indicates that the maximum rate of change of the voltage applied to the gate electrode G decreases as the reference resistance value is greater than the maximum value of the resistance value of the first magnetoresistance effect element 11.

As illustrated in FIGS. 12 and 13, the voltage applied to the gate electrode G decreases as the reference resistance value is greater than the maximum value of the resistance value of the first magnetoresistance effect element 11. As a result, even when the maximum rate of change of the voltage applied to the gate electrode G increases, the magnitude of the conductance of the first field effect transistor 12 does not increase in the constant voltage control in the memristor circuit 10 or the memristor circuit 10A, compared to the case in which the resistance value ratio is included in the region RX1 or RX2. That is, in this case, in the memristor circuit 10 or the memristor circuit 10A, an amplification factor of the conductance of the first magnetoresistance effect element 11 by the first field effect transistor 12 may be less than the case in which the resistance value ratio is included in the region RX1 or RX2.

On the other hand, when the reference resistance value falls within a range between the minimum value of the resistance value of the first magnetoresistance effect element 11 (that is, the resistance value of the first resistance change unit B1) and the maximum value of the resistance value, as illustrated in FIG. 13, the maximum rate of change of the voltage applied to the gate electrode G is the maximum or almost the maximum. In this case, as illustrated in FIG. 12, the voltage applied to the gate electrode G is changed within about 0.4 to 0.6 volts. That is, in this case, as described in FIGS. 6 and 7, the maximum rate of change of the conductance of the first magnetoresistance effect element 11 is about 530%. Accordingly, in this case, in the memristor circuit 10 or the memristor circuit 10A, the conductance of the first magnetoresistance effect element 11 can be reliably increased by the first field effect transistor 12.

As described above, in the memristor circuit according to Modification Example 7 of the embodiment (in Modification Example 7 of the embodiment, the memristor circuit 10 or the memristor circuit 10A), a resistor (in Modification Example 7 of the embodiment, the resistor 13 or the second magnetoresistance effect element 14) has a resistance value that falls within a range between minimum and maximum values of a resistance value of the first resistance change unit (in Modification Example 7 of the embodiment, the first resistance change unit B1). Thus, the memristor circuit can increase the maximum rate of change of the conductance while maintaining the linearity and symmetry in the change in the conductance.

The analog product-sum operator including the memristor circuit or the neuromorphic device using the analog product-sum operator described above can function as any of various sensors or a brain of a robot. When a signal output from a sensor is input to a control device using the neuromorphic device, the neuromorphic device can function as an edge element. In general, there is much noise in a sensor signal. In a general sensor module, a desired sensor signal may not be extracted from noise. Accordingly, for example, a method of removing noise from a time-series signal of a sensor signal to extract a desired signal using a signal processing technology is taken. In this case, signals other than the obtained signal merely consume energy, and thus no information is produced. By inputting the sensor signal to the control device using the neuromorphic device, it is possible to perform high-precise recognition. In the related art, meaningful information is extracted for the first time by separating an observed signal in which noise is superimposed on an original signal into the original signal and the noise. However, when the control device is used, the original signal obtained from the time-series signal including the noise can be predicted, and thus an output intensity, a statistical value, or the like of the original signal can be extracted as a meaningful signal although the output strength, the statistical value, or the like is slight. This is a module in which the sensor and the control device are integrated and can be used as an AI edge sensor module. When the control device is used, recognition precision is high, and therefore information can be extracted with a calculation function less than in the related art, thereby achieving low cost, power saving, and a decrease in volume.

It is preferable to simultaneously input signals of a plurality of sensors to the control device. By simultaneously inputting the signals of the plurality of sensors, it is possible to recognize relevance between the sensors. For example, when sensors are installed in the hands, legs, body of a robot and signals are simultaneously input from the sensors to the control device, it is possible to determine information regarding walking, falling, or the like of the robot comprehensively based on the signals. Further, in a robot, a car, or the like in which a plurality of AI edge sensor modules are installed, further power saving and higher functions can be expected when signals are simultaneously input to the control device. When the plurality of sensors are different kinds of sensors, it is necessary to install a control device corresponding to voltages or currents corresponding to the sensors. In this case, a transformer, an AD converter, or the like is necessary for an interface of the control device, energy is consumed by energy conversion. In AI edge sensor module, energy is also consumed similarly, but a signal output from the AI edge sensor module to a central control device is recognized and identified constantly in the AI edge sensor module and only necessary information can be transmitted. Since communication between the AI edge sensor module and the central control device can be reduced by such a function, it is possible to reduce energy consumption of the system as a whole.

The embodiments of the present invention have been described in detail with reference to the drawings, but specific configurations are not limited to these embodiments and modification, substitution, deletion, and the like may be made without departing from the gist of the present invention.

According to the present invention, it is possible to improve precision of a result when a neuromorphic element is used for product-sum calculation.

EXPLANATION OF REFERENCES 1, 1A, 1B Memristor control system
10, 10A Memristor circuit
11 First magnetoresistance effect element
12 First field effect transistor
13 Resistor
14 Second magnetoresistance effect element
20 Control unit
B1 First resistance change unit
B2 Second resistance unit
B11 First magnetization fixing unit
B12 Second magnetization fixing unit
BC 3-dimensional coordinate system
CP Contact point
D Drain electrode
DW Domain wall
G Gate electrode
L1 First ferromagnetic layer
L2, L5 nonmagnetic layer
L3 Magnetic recording layer
LA Third magnetization fixing unit
L6 Fourth magnetization fixing unit
LY1 First layer
LY2 Second layer
LY3 Third layer
LY4 Fourth layer
LY5 Fifth layer
LY6 Sixth layer
MA Memristor array
P1 First electrode
P2 Second electrode
P3 Third electrode
P4, P5 Electrode
PS1 First power supply
PS2 Second power supply
R1, R2 Magnetic region
S Source electrode

What is claimed is:
1. A memristor circuit comprising:
a first magnetoresistance effect element including a first resistance change unit configured to change a resistance value thereof based on a current flowing therein, a first electrode provided at a first end of the first resistance change unit, and a second electrode provided at a second end of the first resistance change unit;
a first field effect transistor including a gate electrode, the gate electrode being connected to a transmission path between the first electrode connected to a power supply and the power supply; and
a resistor connected between the power supply and a contact point to which the gate electrode is connected in the transmission path.

2. The memristor circuit according to claim 1, wherein the resistor has a resistance value which falls within a range between a minimum value and a maximum value of a resistance value of the first resistance change unit.

3. The memristor circuit according to claim 1,
wherein the resistor is a second magnetoresistance effect element that includes a second resistance unit of which a magnetization state is fixed, an electrode provided at a first end of the second resistance unit, and an electrode provided at a second end of the second resistance unit,
wherein the electrode provided at the first end of the second resistance unit is connected to the power supply, and
wherein the electrode provided at the second end of the second resistance unit is connected to the contact point.

4. The memristor circuit according to claim 2,
wherein the resistor is a second magnetoresistance effect element that includes a second resistance unit configured for a magnetization state thereof to be fixed, an electrode provided at a first end of the second resistance unit, and an electrode provided at a second end of the second resistance unit,
wherein the electrode provided at the first end of the second resistance unit is connected to the power supply, and
wherein the electrode provided at the second end of the second resistance unit is connected to the contact point.

5. The memristor circuit according to claim 1, wherein the first magnetoresistance effect element is stacked on a substrate by a top pin structure.

6. The memristor circuit according to claim 2, wherein the first magnetoresistance effect element is stacked on a substrate by a top pin structure.

7. The memristor circuit according to claim 3, wherein the first magnetoresistance effect element is stacked on a substrate by a top pin structure.

8. The memristor circuit according to claim 1, wherein the first magnetoresistance effect element is stacked on a substrate by a bottom pin structure.

9. The memristor circuit according to claim 2, wherein the first magnetoresistance effect element is stacked on a substrate by a bottom pin structure.

10. The memristor circuit according to claim 3, wherein the first magnetoresistance effect element is stacked on a substrate by a bottom pin structure.

11. A memristor circuit comprising:
a first magnetoresistance effect element including a first resistance change unit configured to change a resistance value thereof based on a current flowing therein, a first electrode provided at a first end of the first resistance change unit, and a second electrode provided at a second end of the first resistance change unit; and
a first field effect transistor including a gate electrode, the gate electrode being connected to a transmission path between the first electrode connected to a power supply and the power,
wherein a switching element is connected between the power supply and the gate electrode.

12. The memristor circuit according to claim 1, wherein a switching element is connected between the power supply and the gate electrode.

13. The memristor circuit according to claim 2, wherein a switching element is connected between the power supply and the gate electrode.

14. The memristor circuit according to claim 3, wherein a switching element is connected between the power supply and the gate electrode.

15. A memristor control system comprising:
a memristor circuit; and
a control unit configured to control the memristor circuit,
wherein the memristor circuit comprises:
a first magnetoresistance effect element including a first resistance change unit configured to change a resistance value thereof based on a current flowing therein, a first electrode provided at a first end of the first resistance change unit, and a second electrode provided at a second end of the first resistance change unit; and
a first field effect transistor including a gate electrode, the gate electrode being connected to a transmission path between the first electrode connected to a power supply and the power supply,
wherein the first magnetoresistance effect element is a domain wall movement magnetoresistance effect element,
wherein the first resistance change unit has a domain wall,
wherein a third electrode is provided at a third end of the first resistance change unit,
wherein, in the first resistance change unit, a resistance value is changed by movement of the domain wall based on a current flowing between the second and third electrodes, and
wherein the control unit changes a resistance value of the first resistance change unit by causing a pulse current with a pulse width to flow based on a resistance value of the first resistance change unit between the second electrode and the third electrode.

16. An analog product-sum operator comprising:
one memristor circuit or a plurality of memristor circuits,
wherein the one memristor circuit or each of the plurality of memristor circuits comprises:
a first magnetoresistance effect element including a first resistance change unit configured to change a resistance value thereof based on a current flowing therein, a first electrode provided at a first end of the first resistance change unit, and a second electrode provided at a second end of the first resistance change unit; and
a first field effect transistor including a gate electrode, the gate electrode being connected to a transmission path between the first electrode connected to a power supply and the power supply.

17. A neuromorphic device comprising:
one memristor circuit or a plurality of memristor circuits,
wherein the one memristor circuit or each of the plurality of memristor circuits comprises:
a first magnetoresistance effect element including a first resistance change unit configured to change a resistance value thereof based on a current flowing therein, a first electrode provided at a first end of the first resistance change unit, and a second electrode provided at a second end of the first resistance change unit; and a first field effect transistor including a gate electrode, the gate electrode being connected to a transmission path between the first electrode connected to a power supply and the power supply.

* * * * *